(12) United States Patent
Cole et al.

(10) Patent No.: US 11,574,859 B2
(45) Date of Patent: Feb. 7, 2023

(54) POWER MODULE HAVING AN ELEVATED POWER PLANE WITH AN INTEGRATED SIGNAL BOARD AND PROCESS OF IMPLEMENTING THE SAME

(71) Applicant: Cree Fayetteville, Inc., Fayetteville, AR (US)

(72) Inventors: Zach Cole, Summers, AR (US); Steven Ericksen, St. Rogers, AR (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 17/034,815

(22) Filed: Sep. 28, 2020

(65) Prior Publication Data
US 2022/0102260 A1 Mar. 31, 2022

(51) Int. Cl.
| | | |
|---|---|---|
| *H05K 1/18* | (2006.01) | |
| *H01L 23/498* | (2006.01) | |
| *H01L 25/07* | (2006.01) | |
| *H05K 1/14* | (2006.01) | |

(52) U.S. Cl.
CPC ...... *H01L 23/49838* (2013.01); *H01L 25/072* (2013.01); *H05K 1/147* (2013.01); *H05K 1/181* (2013.01); *H05K 1/142* (2013.01); *H05K 2201/042* (2013.01); *H05K 2201/10151* (2013.01); *H05K 2201/10166* (2013.01)

(58) Field of Classification Search
CPC . H01L 23/49838; H01L 25/072; H05K 1/147; H05K 1/181; H05K 2201/10166; H05K 2201/042; H05K 2201/10151; H05K 1/142
See application file for complete search history.

(56) References Cited

U.S. PATENT DOCUMENTS

| | | | | |
|---|---|---|---|---|
| 9,407,251 | B1* | 8/2016 | Passmore | H05K 1/0243 |
| 9,839,146 | B2* | 12/2017 | Cole | H01L 29/1608 |
| 10,784,235 | B2* | 9/2020 | McPherson | H01L 23/3735 |
| 11,069,640 | B2* | 7/2021 | McPherson | H01L 24/49 |
| 2004/0184239 | A1* | 9/2004 | Zimmerman | H01L 23/047 |
| | | | | 361/712 |
| 2009/0029570 | A1* | 1/2009 | Ikeuchi | H05K 1/147 |
| | | | | 439/67 |
| 2010/0065962 | A1 | 3/2010 | Bayerer | |
| 2010/0181101 | A1 | 7/2010 | Han et al. | |
| 2013/0015496 | A1* | 1/2013 | Konno | H01L 25/072 |
| | | | | 257/140 |

(Continued)

OTHER PUBLICATIONS

Design U.S. Appl. No. 29/663,505, filed Sep. 17, 2018.

(Continued)

*Primary Examiner* — Binh B Tran
(74) *Attorney, Agent, or Firm* — BakerHostetler

(57) ABSTRACT

A power module includes at least one electrically conductive power substrate; and a plurality of power devices arranged on and connected to the at least one electrically conductive power substrate. The power module further includes at least one elevated signal element electrically connected to the plurality of power devices and/or at least one elevated power plane electrically connected to the at least one electrically conductive power substrate and electrically connected to the plurality of power devices.

24 Claims, 22 Drawing Sheets

(56) References Cited

U.S. PATENT DOCUMENTS

| | | | | |
|---|---|---|---|---|
| 2013/0105961 A1* | 5/2013 | Jones | ............... | H01L 23/24 |
| | | | | 257/691 |
| 2014/0118962 A1 | 5/2014 | Sabavat et al. | | |
| 2014/0339687 A1 | 11/2014 | Kumar et al. | | |
| 2018/0122562 A1* | 5/2018 | Ji | ............... | H05K 1/185 |
| 2018/0175833 A1* | 6/2018 | Curbow | ............... | H03K 5/08 |
| 2018/0206359 A1* | 7/2018 | McPherson | ............... | H02M 7/003 |

OTHER PUBLICATIONS

International Patent Application No. PCT/US2021/051522; Int'l Search Report and the Written Opinion; dated Dec. 23, 2021; 9 pages.

\* cited by examiner

POWER MODULE HAVING AN ELEVATED POWER PLANE WITH AN INTEGRATED SIGNAL BOARD AND PROCESS OF IMPLEMENTING THE SAME

BACKGROUND OF THE DISCLOSURE

As will be appreciated by those skilled in the art, power modules are known in various forms. Power modules provide a physical containment for power components, usually power semiconductor devices. These power semiconductors are typically soldered or sintered on a power electronic substrate. The power module typically carries the power semiconductors, provides electrical and thermal contact, and includes electrical insulation.

Current trends in electrification are placing increasing demands on power modules including the power semiconductor devices, power electronics, and/or the like associated with the power modules. For example, improved efficiency, improved operation, and higher power density. These demands extend from the system level down to the component level. However, the area for implementing components within power modules is limited, which accordingly limits improvements to efficiency, improvements in operation, and increases in power density.

Accordingly, what is needed is a power module configured to have improved efficiency, improved operation, a higher power density, and/or the like.

SUMMARY OF THE DISCLOSURE

One general aspect includes a power module, may include: at least one electrically conductive power substrate; a plurality of power devices arranged on and connected to the at least one electrically conductive power substrate; and the power module may include at least one of the following: at least one elevated signal element electrically connected to the plurality of power devices and arranged above the at least one electrically conductive power substrate; and at least one elevated power plane electrically connected to the at least one electrically conductive power substrate, electrically connected to the plurality of power devices, and arranged vertically offset from the at least one electrically conductive power substrate.

One general aspect includes a process of configuring a power module, may include: providing at least one electrically conductive power substrate; arranging a plurality of power devices on and connecting the plurality of power devices to the at least one electrically conductive power substrate; and connecting at least one elevated power plane electrically to the at least one electrically conductive power substrate and electrically connecting the at least one elevated power plane electrically to the plurality of power devices, where the at least one elevated power plane is arranged vertically offset from the at least one electrically conductive power substrate.

One general aspect includes a power module, may include: at least one electrically conductive power substrate; a plurality of power devices arranged on and connected to the at least one electrically conductive power substrate; at least one elevated signal element electrically connected to the plurality of power devices; and at least one elevated power plane electrically connected to the at least one electrically conductive power substrate and electrically connected to the plurality of power devices, where the at least one elevated power plane is arranged vertically offset from the at least one electrically conductive power substrate; and where the at least one elevated signal element is arranged vertically offset from the at least one elevated power plane.

One general aspect includes a power module, may include: at least one electrically conductive power substrate; a plurality of power devices arranged on and connected to the at least one electrically conductive power substrate; and at least one elevated power plane electrically connected to the at least one electrically conductive power substrate, electrically connected to the plurality of power devices, and arranged vertically offset from the at least one electrically conductive power substrate.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1B:
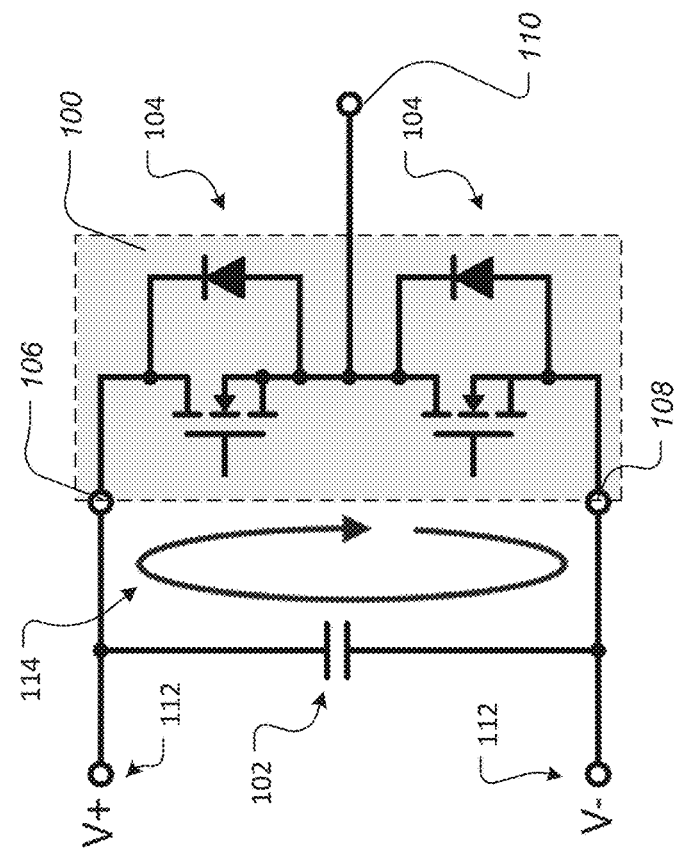
FIG. 1B illustrates a current loop between DC link capacitors and switch positions inside of the power module of FIG. 1A.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

The disclosure is directed to a power module having an elevated power plane. The disclosure is further directed to a process of implementing a power module having an elevated power plane. The disclosure is further directed to a power module having an elevated signal board. The disclosure is further directed to a process of implementing a power module having an elevated signal board. The disclosure is further directed to a power module having an elevated power plane and an elevated signal board. The disclosure is further directed to a process of implementing a power module having an elevated power plane and an elevated signal board. The disclosure is further directed to a power module having an elevated power plane with an integrated signal board. The disclosure is further directed to a process of implementing a power module having an elevated power plane with an integrated signal board.

The disclosed power module may be configured to evenly distribute current between large arrays of devices with a significantly lower loop inductance than standard packaging approaches. The layout of the power module is highly configurable and may be configured to adopt most power circuit topologies common in the power electronics industry.

The power devices of the power module range in structure and purpose. The term 'power device' refers to various forms of transistors and diodes designed for high voltages and currents. The transistors may be controllable switches allowing for unidirectional or bidirectional current flow (depending on device type) while the diodes may allow for current flow in one direction and may not be controllable. The transistor types may include but are not limited to Metal Oxide Field Effect Transistor (MOSFET), a Junction Field Effect Transistor (JFET), Bipolar Junction Transistor (BJT), Insulated Gate Bipolar Transistor (IGBT), and the like.

This disclosure further describes a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. Conventional power electronic packages are limited in their functionality for these semiconductors, having internal layouts intended for silicon (Si) device technologies.

The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein. The key metrics of the WBG semiconductors may include one or more of the following non-limiting aspects: Higher voltage blocking, Higher current density, Higher temperature operation, Faster switching, Improved thermal performance, Lower on-resistance (reduced conduction losses), Lower turn-on and turn-off energies (reduced switching losses), and so on. It should be appreciated that these above-noted key metrics of the WBG semiconductors are not required and may not be the implemented in some aspects of the disclosure. To effectively utilize the WBG semiconductor devices, a power module (also referred to as a power package) is employed.

Present technology for power modules is heavily reliant on a single layer of ceramic insulation—metallized top and bottom using direct bond or active-metal braze copper of a similar thickness (i.e., the substrate)—providing: a top metal layer for patterning nodes of a circuit, a thermal conduit between the power devices and the baseplate, in addition to mechanical support for the power devices.

The top metal layer of the ceramic, where the power devices reside, is etched to route electrical current to and from the power devices without electrical shorting. These supply and return paths take up area and need to be routed around each other, and around other components, for the power module to properly function. As described by the disclosure, by placing an elevated and supported metal layer above the power devices utilizing at least one elevated power plane 124 and/or at least one elevated signal element 118 as described herein, area is freed up on the substrate to add more power devices, additional components (e.g., thermal sensors, current sensors, capacitors, etc.), larger metal planes to carry more current, easier layout geometries, more flexibility on where parts are placed, or any combinations of these, resulting in a higher density power module package.

The elevated signal board utilizing the at least one elevated signal element 118 as described herein may be implemented using a standard printed circuit board (PCB), a stiffer insulated metal substrate (IMS) technology, other variations for high-voltage prototype modules, and/or the like. For example, other variations for high-voltage prototype modules may be implemented primarily for voltage isolation reasons to make the substrate layout simpler, allow for a higher power density module, and/or the like.

The integration of an elevated signal board and an elevated power plane utilizing the at least one elevated power plane 124 and/or the at least one elevated signal element 118 as described herein further simplifies the geometry of the original conducting plane on top of the substrate. This integration allows for more design flexibility in routing power and signal paths to the power devices. In addition, in an embodiment using an IMS or similar technology, where the signal paths are practically printed or laminated directly onto the power conductor, it can reduce overall part count and assembly complexity (and in some cases, reduces cost). Effectively, introducing an additional layer of metal into the power module can also increase the overall ampacity of the power module.

The added range of choice in signal and power path routing coupled with a greater range of choice for device layout/location can have added benefits in terms of allowing a lower device density or positioning for better thermal performance and for lower package inductances.

In the case of lowering package inductance, the layered planar geometry of the elevated power plane above the original substrate power plane provides a near ideal low inductance loop geometry (small conductor separation, short total path, and wide current path).

More specifically, the disclosure uses conducting plane(s), on a separate level elevated above that built into the ceramic substrates used to isolate the baseplate from the rest of the power module, to route either signal and/or power conduction. This "hoverboard" or "lifted" or "elevated" approach helps solve the problem of limited/finite substrate area for placing additional power devices, sensors, connectors, conductive power and signal paths, and so on by moving some of that functionality onto another elevated plane (i.e., from 2-D to 3-D) within the package.

One aspect of the disclosure may include a power module where the drain sides of the power die are connected electrically to the metallization of the substrate upon which they are mounted. The source wire bonds however are connected not to another pad of metal on the same ceramic substrate but instead are connected up to a layer of metal, for example, through holes in that plane above the die, which is in turn may be connected to (and perhaps may even be the same piece of metal as) the external power terminals of the power module.

One aspect of the disclosure may include a power module that includes, on at least one side, a printed circuit board (PCB) element resting atop the conductive power plane. This is to represent a way of routing the control and sensing signals on yet another conducting plane (or set of planes). This PCB could be mounted above the power plane, as illustrated in the Figures of the disclosure, or below. A similar circuit layer component (or an extension of the one shown) could also be arranged over another side of the power module, to provide control and/or sensing on that side of the power module.

One aspect of the disclosure may include a power module that includes an integrated version of the signal plane. The integrated version of the signal plane may be an embodiment where the circuit board layer was reduced to a thick film, printed, and/or laminated structure (such as an insulated metal substrate (IMS)) where the insulating and conducting layers of the circuit board are made/laid down/printed directly to a surface of the power plane. In the case of an IMS implementation, this would result in a single purchased part which would integrate the power and signal layers all in one. It may be positioned within the power module, then both the power and signal wire bonds could be placed. The whole structure could then be encapsulated, tested, and shipped.

It should be noted that the IMS may include a bottom metal layer, which is usually aluminum or copper, and is normally used as the baseplate and is thus at ground potential. However, in aspects of the disclosure the IMS bottom metal layer may be used in a novel way—as a high-current conductor and/or as a carrier of other internal circuits such as the Gate-Kelvin auxiliary terminal distribution network, or sensors such as temperature, current, or voltage.

Further aspects of the disclosure are related to the implementation of a power module wherein the drains of all the transistors, such as Metal Oxide Field Effect Transistor (MOSFET) dies (or collectors for Insulated Gate Bipolar Transistors (IGBTs)) are electrically connected to a substrate's top metallization upon which they are mounted. The source power wire bonds, however, are not connected to another metal pad on the same ceramic substrate as is typical; but instead, they make an electrical connection to an elevated metal layer (e.g., in this case through holes placed in that elevated metal layer above the die, which is in turn connected—directly or indirectly—to the power module's external power terminals).

At one side of the power module a signal distribution element may be layered onto a thick metal conductive power plane. This represents a way of routing the auxiliary control and/or sensing signals on yet another conducting plane (or possibly multiple conducting planes). This signal distribution element structure would most likely be mounted above the power plane for ease in making wire bond electrical connections, but it is also possible to be below it if one or more advantages to that orientation exist in a given implementation. A similar integrated component may be implemented on another side of the power module to provide auxiliary control and/or sensing signals on that side.

An "integrated version" of the signal planes (e.g., one over the high-side and low-side switch positions) would be an embodiment wherein the lifted signal distribution element layer was reduced in practice to a thick film, printed, and/or laminated structure (e.g., such as an Insulated Metal Substrate (IMS) circuit board technology, or flexible circuit technology) where the insulating and conducting layers of the circuit board are made/laid down/printed/adhered/placed directly into or onto the power plane surface. In the case of an IMS embodiment, this may result in a single purchased part, which may integrate the power and signal and/or control layers all in one. In one aspect, it may be physically positioned within the module first before placing both the power and signal wire bonds. Subsequently, the resulting structure may be encapsulated, lidded, end-of-line tested, and/or the like.

The integration of 1) an elevated low-power signal distribution element; and 2) an elevated high-power plane further simplifies the geometry, trace density, and increases the utilization of the original top conducting ceramic substrate plane. This integration would essentially depopulate/remove previously existing low-power and high-power elements from the top metallization plane enabling increased "real estate" for more power semiconductors (i.e., SiC MOSFETs, SiC Junction Barrier Schottky (JBS) diodes, SiC IGBTs, Si power MOSFETs, Si IGBTs, etc.). This would, in theory, allow increased ampacity for the same substrate footprint or allow the integration of other application circuits (e.g., temperature sensors, current sensors, etc.) This integration also allows the module designer more design flexibility in routing power and signal paths to the power semiconductor devices since adding one additional dimension (i.e., moving from 2-D to 3-D) enables additional design degrees of freedom.

In addition, in an embodiment using an IMS circuit board or like technology where the signal paths are printed or laminated directly into or onto the power conductor, an overall part count, assembly complexity, and cost may be reduced.

An opportunity also exists to place passive devices—such as gate or source resistors, capacitors, and/or the like— within some power modules utilizing an internal gate-source-Kelvin (GSK) printed circuit board. Integrating that low-power signal distribution circuit directly with a high-power conducting plane provides the opportunity to easily locate and connect sensors—such as temperature sensors or current sensors that otherwise either may not fit or be easily connected. Since the signal layers now lie directly above the power plane, it is much simpler to place and connect to an inductive, Hall Effect, and/or resistive shunt current sensor mounted directly around, on, or very near the lifted power plane.

In the case of a thermal sensor, these usually are placed directly on the top of the metallized ceramic substrate nearest the hottest power devices to sense the maximum temperature within the power module. This usually necessitates a list of design compromises due to incompatible voltages, sensor sizes, and connection routing paths. Having the integrated circuitry can greatly simplify the connection complexity either by reducing needed wire bond lengths or signal path space taken up on the power substrate, or by having the sensor mounted directly on the integrated circuit layer in a location closely coupled thermally to the heat-generating power devices (such as where the lifted power plane is connected to the substrate).

An important thing to note about the integrated signal layers is that some implementations of the disclosure allow for the signal layers to be bent out of plane either as a separate but connected element (like a flexible ribbon cable to make connection to other inner parts of or fed to components outside of the power module) or along bends made in the underlying power plane metal. Unlike the use of a standard planar circuit board, this flexibility allows for a much greater range of design options when it comes to routing and connecting either internal signal paths or to make external connections to gate driver boards for instance.

Lastly, applying some forethought to exactly when in the assembly process those bends are made, passive components (e.g., resistors, sensors, sockets, pins, blades, etc.) can be placed on the circuit and processed in bulk just as standard printed circuit boards and their components are populated in a highly automated way. This assembly step could possibly be outsourced to a standard board house at a very low cost and then bends could be added before or during final assembly.

Figure 1A:
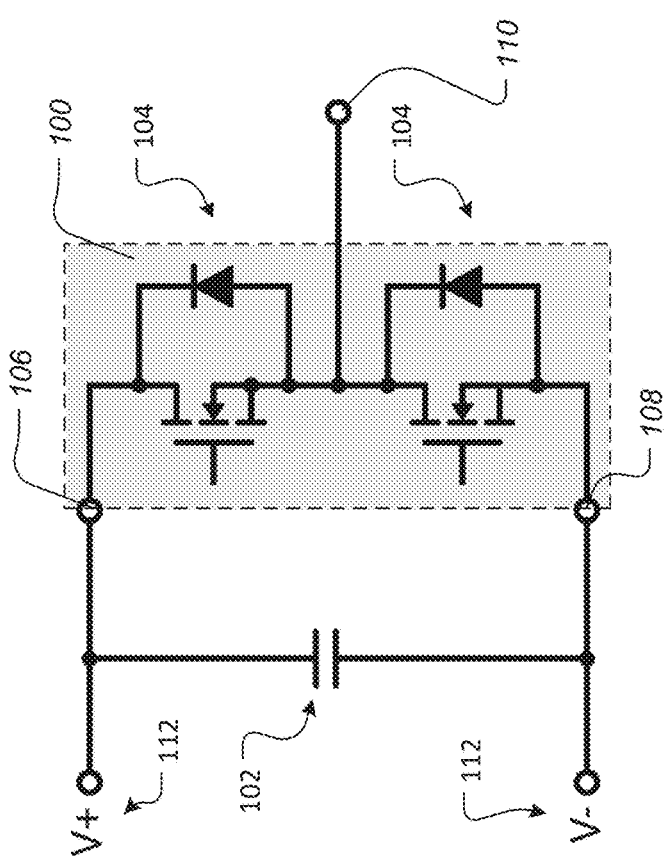
FIG. 1A schematically illustrates a half-bridge based topology of a power module according to aspects of the disclosure.

FIG. 1A schematically illustrates a half-bridge based topology of a power module according to aspects of the disclosure.

In particular, FIG. 1A illustrates a power module 100 implemented with a half-bridge based topology that may be considered a fundamental building block in many switching power converters. For motor drives, inverters, DC-DC converters, and/or the like these topologies are typically connected to a DC supply 112, with DC link capacitors 102 as an intermediate connection between them. However, the power module 100 of the disclosure may be implemented without the DC link capacitors 102.

The DC link capacitors 102 may act to filter ripple on the line and counter the effects of inductance in the current path. Two half-bridges in parallel may form a full-bridge, while three in parallel may form a three phase topology. The three phase topology is also often referred to as a six pack, signifying the six switch positions among the three phase legs. Moreover, other topologies are contemplated for the power module including common source, common drain, neutral point clamp, and/or the like.

FIG. 1A further illustrates the power module 100 having one or more switch positions 104. The power module 100 may include a first terminal 106, a second terminal 108, and a third terminal 110.

FIG. 1B illustrates a current loop between the DC link capacitors 102 and switch positions 104 inside of the power module of FIG. 1A. The current loop 114 between the DC link capacitors 102 and the switch positions 104 inside of the power module 100 is crucially important in the system, having a significant influence in the switching performance of the semiconductors.

No system is perfect; for example, undesirable parasitic resistances, capacitances, and inductances are present in any electrical system. These impedances introduce detrimental effects on the performance and reliability unless they are reduced or mitigated. While a resistance and capacitance may be associated with each interconnection, the most influential for switching power devices may be the parasitic inductance. Higher inductances result in higher stored energy in the magnetic field, which causes voltage overshoots and ringing during switching transitions.

Figure 2:
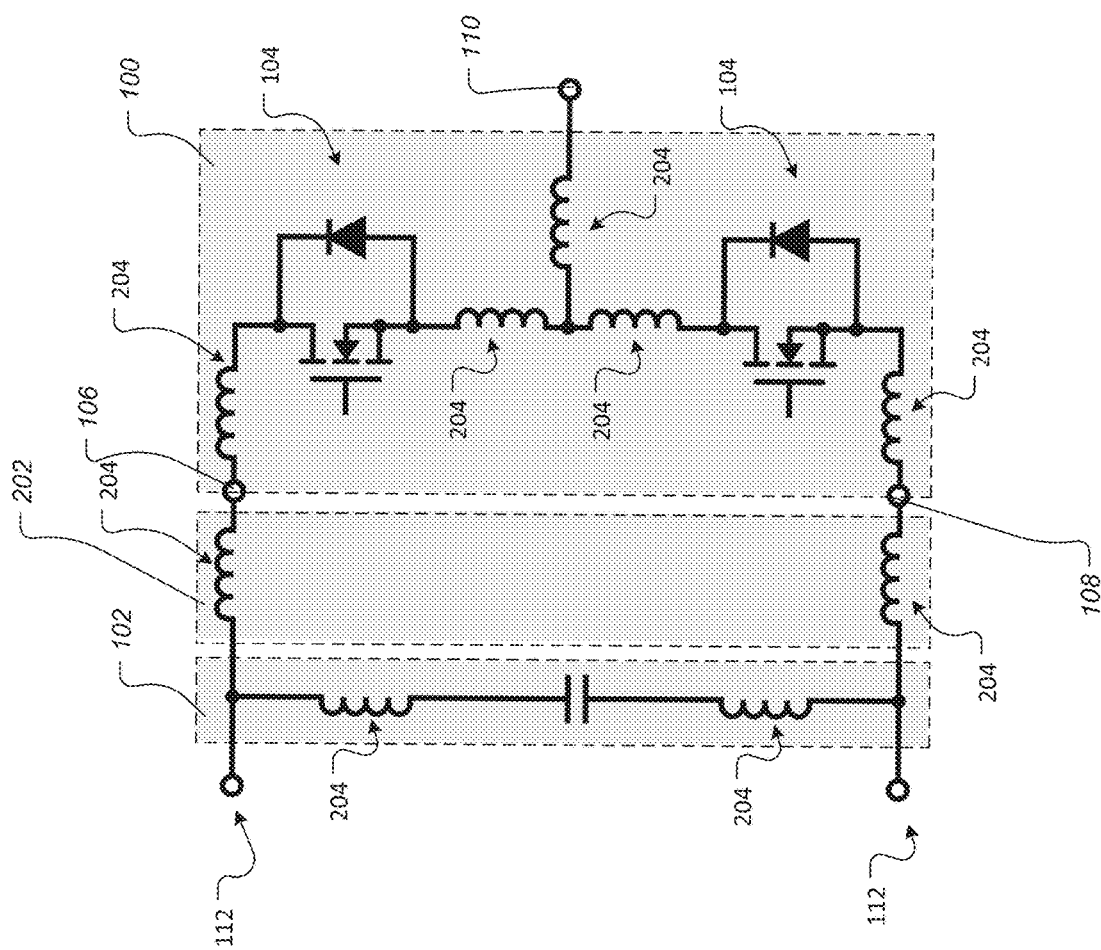
FIG. 2 illustrates various interconnections and associated impedances according to aspects of the disclosure.

FIG. 2 illustrates various interconnections and associated impedances according to aspects of the disclosure.

For a power conversion system, such as the half-bridge configuration of the power module 100 presented in FIG. 1A, there are impedances 204 within each component including the DC link capacitors 102, a bussing system, and the power module 100, and the like and in the physical interconnections between them. This is depicted in FIG. 2 for the inductance. More functional elements and associated impedances are often present in power converters; however, for switching performance this loop may be the most significant.

In most power converters, these inductances must be carefully accounted for in the system design. Often, this requires adding more of the DC link capacitors 102 or slowing down the switching speed to counter the parasitic effects. While effective, it results in a bulkier system (more large and heavy capacitors) with higher losses (due to a slower switching event where both high currents and voltages are present).

In power packages intended for Si devices, the turn-on and turn-off times typical of a Si IGBT are inherently slow enough that the inductances encountered in the internal power loop are sufficiently low. However, for extremely fast switching of wide band gap devices, such as SiC MOSFETs, the inductances in conventional packages can result in voltage overshoots of hundreds of volts.

These issues are further amplified due to the need to parallel many SiC devices together to reach high current levels in the power module 100. A paralleled array of power switches and diodes in a variety of combinations (all switches, all diodes, interleaved diodes, edge diodes, etc.) is referred to as a 'position' or 'switch position'. Each switch in the switch position 104 acts together as a single effective switch, increasing the amount of current the circuit can process or reducing the overall loss by lowering the effective resistance.

Figure 3:
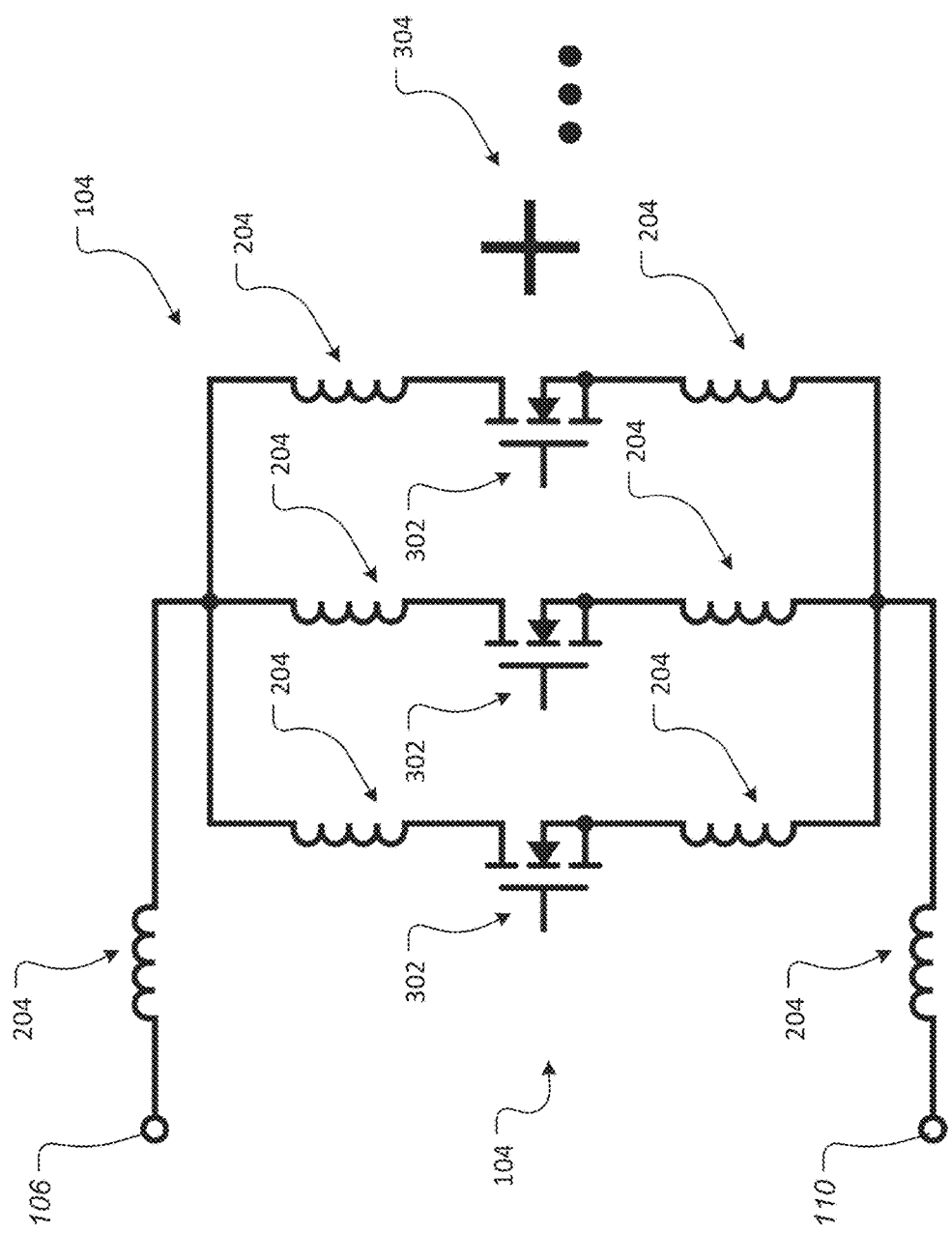
FIG. 3 illustrates various interconnections and associated impedances of a switch position according to aspects of the disclosure.

FIG. 3 illustrates various interconnections and associated impedances of a switch position according to aspects of the disclosure.

In a switch position 104, each switch or power device 302 has its own individual current path in the structure. Each interconnection has an associated impedance 204, as illustrated in FIG. 3. As further shown in FIG. 3, the switch position 104 may include any number of power devices 302 as indicated by the symbology shown at arrow 304. Care must be taken to ensure that the effective current paths are equalized between the power devices 302, such that they each see matched inductances. Otherwise, the current and voltages encountered during switching transitions may not be equivalently shared between the power devices 302 across a switch position 104, unevenly stressing the components and increasing switching losses. This is exacerbated by thermal effects—uneven current loading and switching events create uneven heat rise, which results in a drift in semiconductor properties and more instability across a paralleled switch position 104.

Conventional power packages are typically designed for a single Si IGBT, or a small number of these devices (usually 4 or less). Consequently, they are not suitable for paralleling large numbers of SiC MOSFETs and diodes (or similar wide band gap devices) in a manner which results in clean, well-controlled switching.

Figure 4:
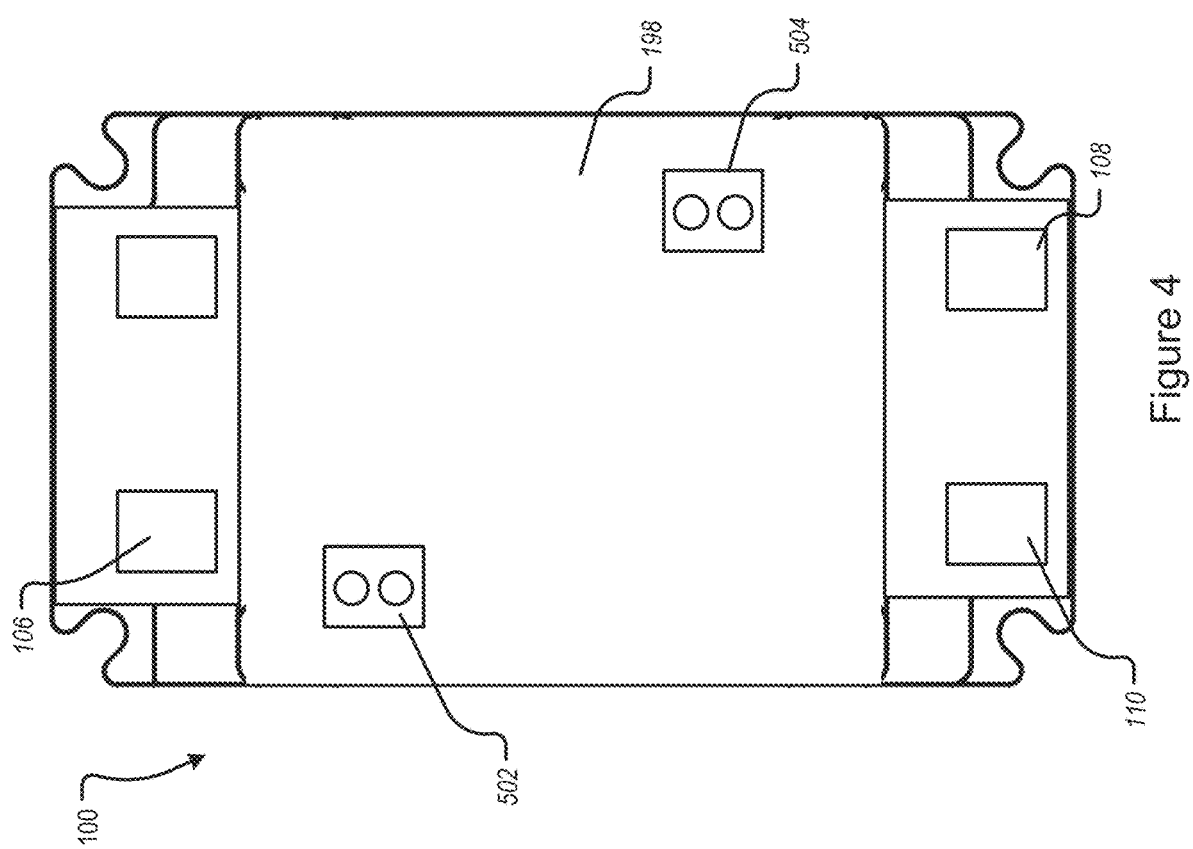
FIG. 4 illustrates a top schematic view of a power module according to an aspect of the disclosure.

FIG. 4 illustrates a top schematic view of a power module according to an aspect of the disclosure.

In particular, a half-bridge configuration of the power module 100 is illustrated in FIG. 4. The disclosed power module 100 addresses each of the previously listed concerns with a custom designed power layout and associated structure to facilitate most common bridge topologies with each switch position 104 possessing an equalized, low inductance current path. The first terminal 106, the second terminal 108, and the third terminal 110 may be arranged such that the path to the external connections such as connections to the DC link capacitors 102 may have a correspondingly low inductance as well. For example, the connections may include connections to buss bars, which may include uncomplicated laminated buss bars requiring no bends or special design features as described in greater detail below.

A power terminal pin-out of a single half-bridge configuration of the power module 100 is depicted in FIG. 4. In this regard, the first terminal 106 may be the V+ terminal, the second terminal 108 may be the V− terminal, and the third terminal 110 may be an output terminal. However, the first terminal 106, the second terminal 108, and the third terminal 110 be configured to provide any type of terminal, terminal connection, terminal function, input function, output function, power function, and/or the like. The power module 100 may include signal terminals 502, 504. The specific pin-out of the signal terminals 502, 504 may be modular and may be modified as necessary. The signal terminals 502, 504 may be implemented by signal pins for differential signal transfer. Of course, any number of signal pins and any number of signal terminals may be implemented to provide the functionality as described in conjunction with the disclosure.

Each switch position 104 may utilize a pair of pins with the signal terminals 502, 504 for the gate signal and a source kelvin for optimal control. The other pin pairs of the signal terminals 502, 504 may be used for an internal temperature sensor, overcurrent sensing, or for other diagnostic signals. It is contemplated that more or less pins and/or more or less signal terminals may also be added to if necessary, as long as they do not result in voltage isolation issues. In some aspects, the other diagnostic signals may be generated from diagnostic sensors that may include strain gauges sensing vibration, and the like. The diagnostic sensors can also determine humidity. Moreover, the diagnostic sensors may sense any environmental or device characteristic.

Figure 5:
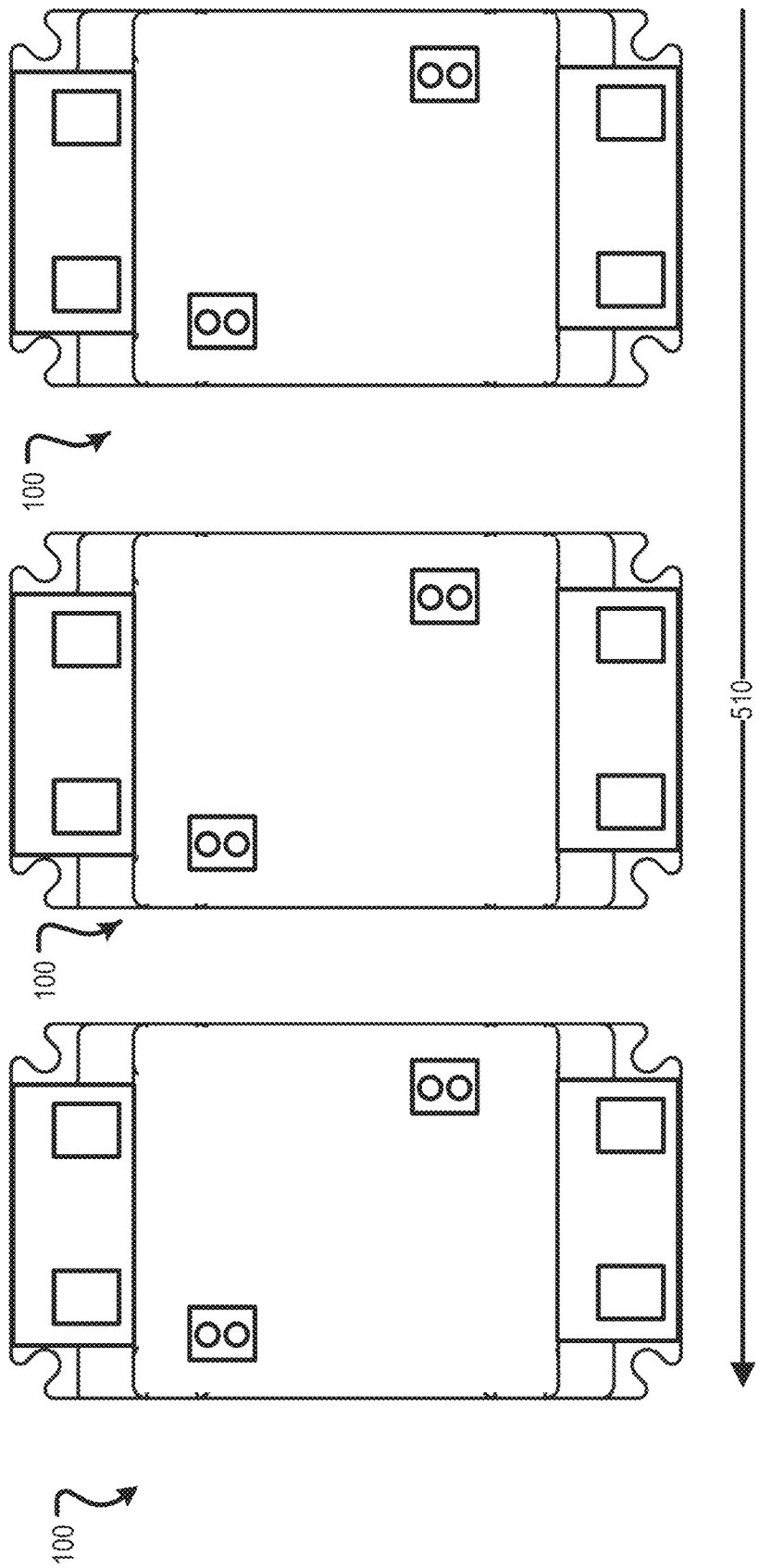
FIG. 5 illustrates a plurality of single phase modules in a paralleled configuration according to aspects of the disclosure.

FIG. 5 illustrates a plurality of single phase modules in a paralleled configuration according to aspects of the disclosure.

In this regard, the power module 100 may be configured such that modularity is fundamental. A single phase configuration of the power module 100 may be easily paralleled to reach higher currents. As is illustrated in FIG. 5, three power modules 100 are illustrated, but there is no limit to how many could be configured in this manner. In this regard, an arrow 510 shows that additional configurations of power module 100 may be arranged in parallel. When paralleled, each of the corresponding ones of the first terminal 106, the second terminal 108, and the third terminal 110 may be electrically connected between each of the power modules 100.

Figure 6B:
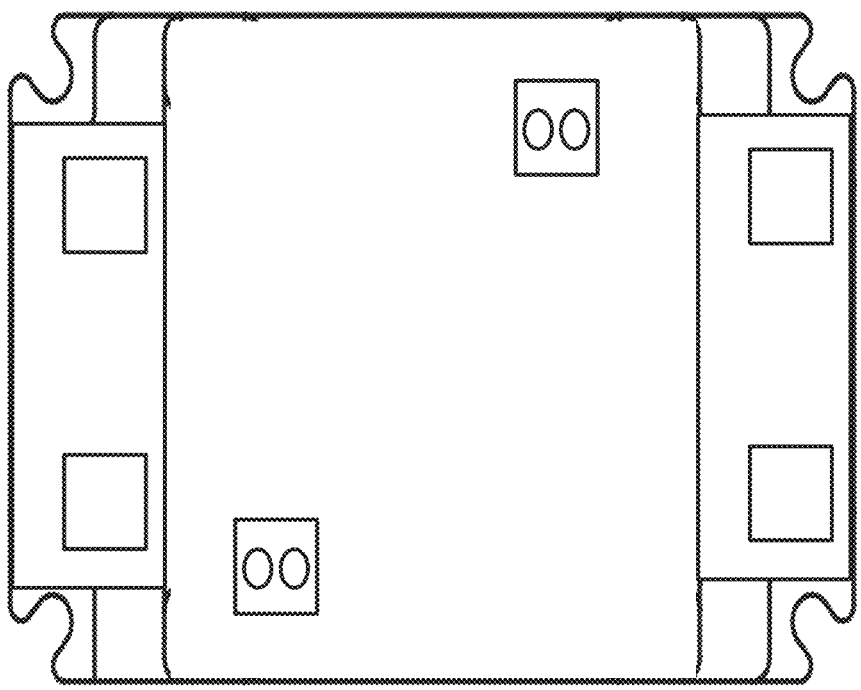
FIG. 6B illustrates a second power module configuration according to aspects of the disclosure.
Figure 6A:
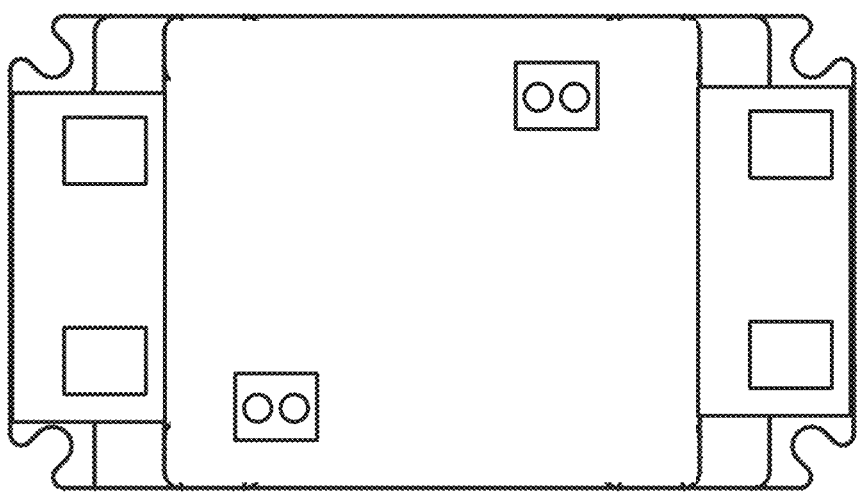
FIG. 6A illustrates a first power module configuration according to aspects of the disclosure.

FIG. 6A illustrates a first power module configuration according to aspects of the disclosure; and FIG. 6B illustrates a second power module configuration according to aspects of the disclosure.

With reference to FIG. 6A and FIG. 68, the power module 100 may be configured such that scalability of the disclosed power modules 100 may be utilized and accordingly may be another defining feature. This is depicted in FIG. 6A and FIG. 6B. As shown in FIG. 6B, the power module 100 width may be extended to accommodate more devices for each switch position 104 in comparison to the power module 100 shown in FIG. 6A. It is important to note that the power modules 100 may be as shown in FIG. 5 or may be scaled as shown in FIG. 6B to match most power levels without sacrificing the benefits of this disclosure including, for example, low inductance, clean switching, high power density, and/or the like.

Figure 7:
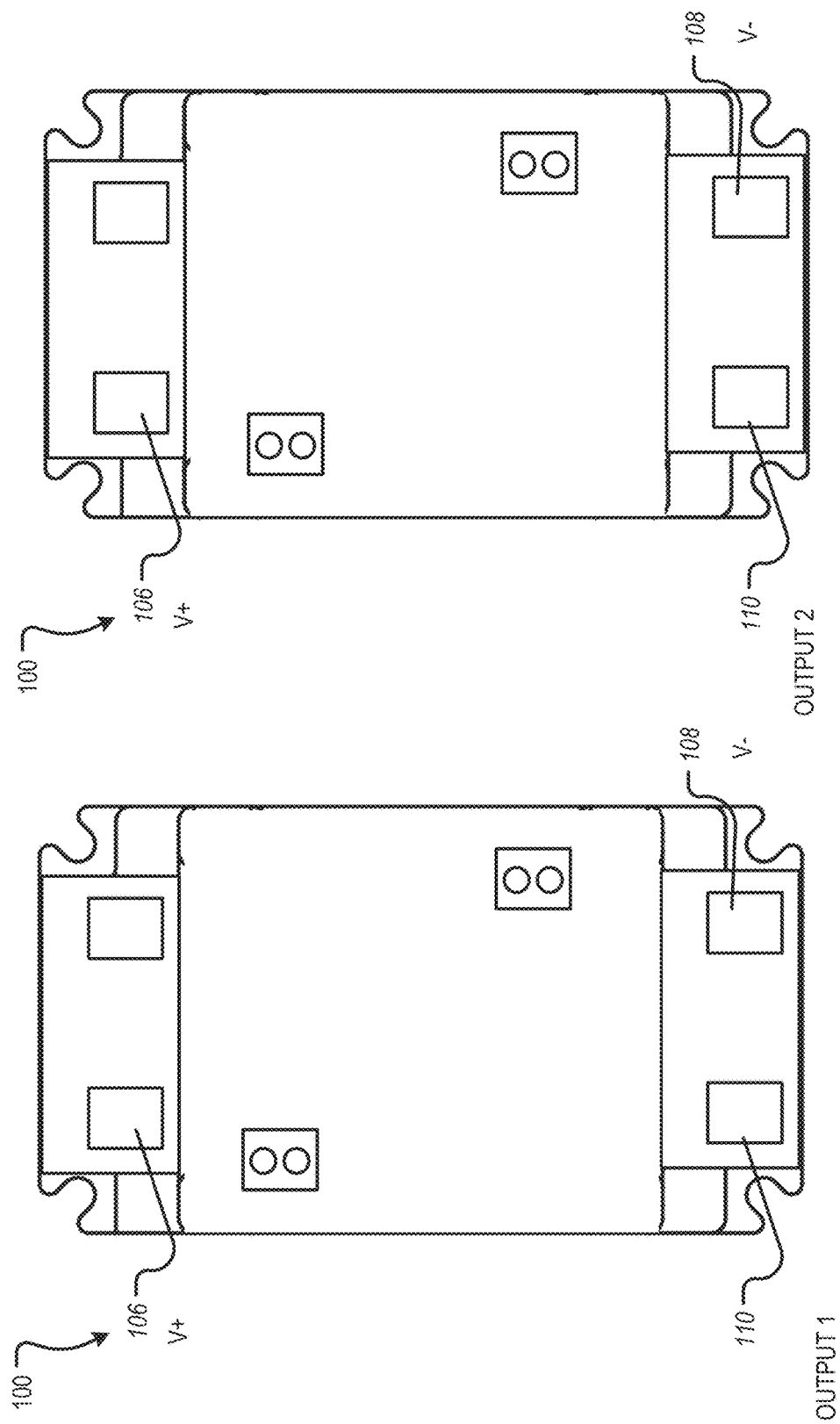
FIG. 7 illustrates a plurality of power modules in a full bridge configuration according to aspects of the disclosure.
Figure 8:
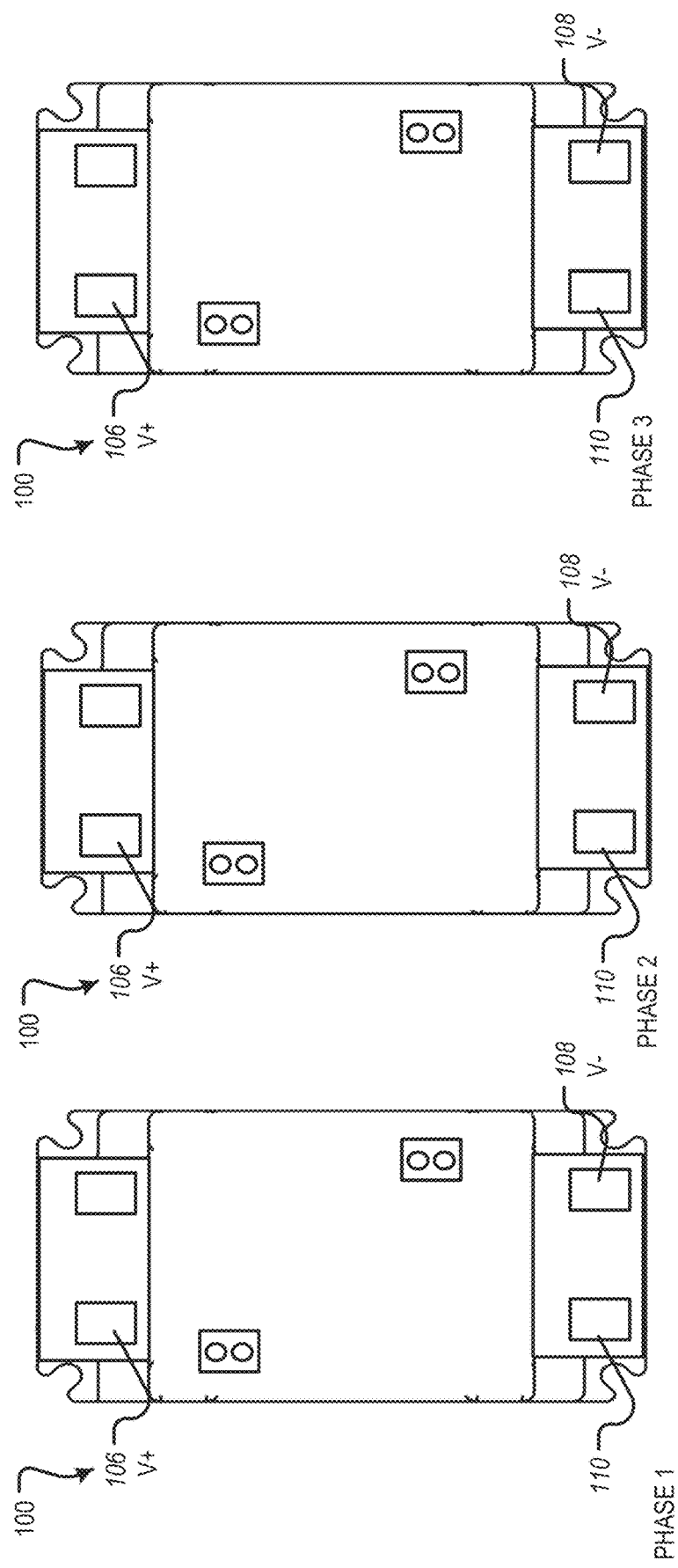
FIG. 8 illustrates a plurality of power modules in a three-phase configuration according to aspects of the disclosure.
Figure 9:
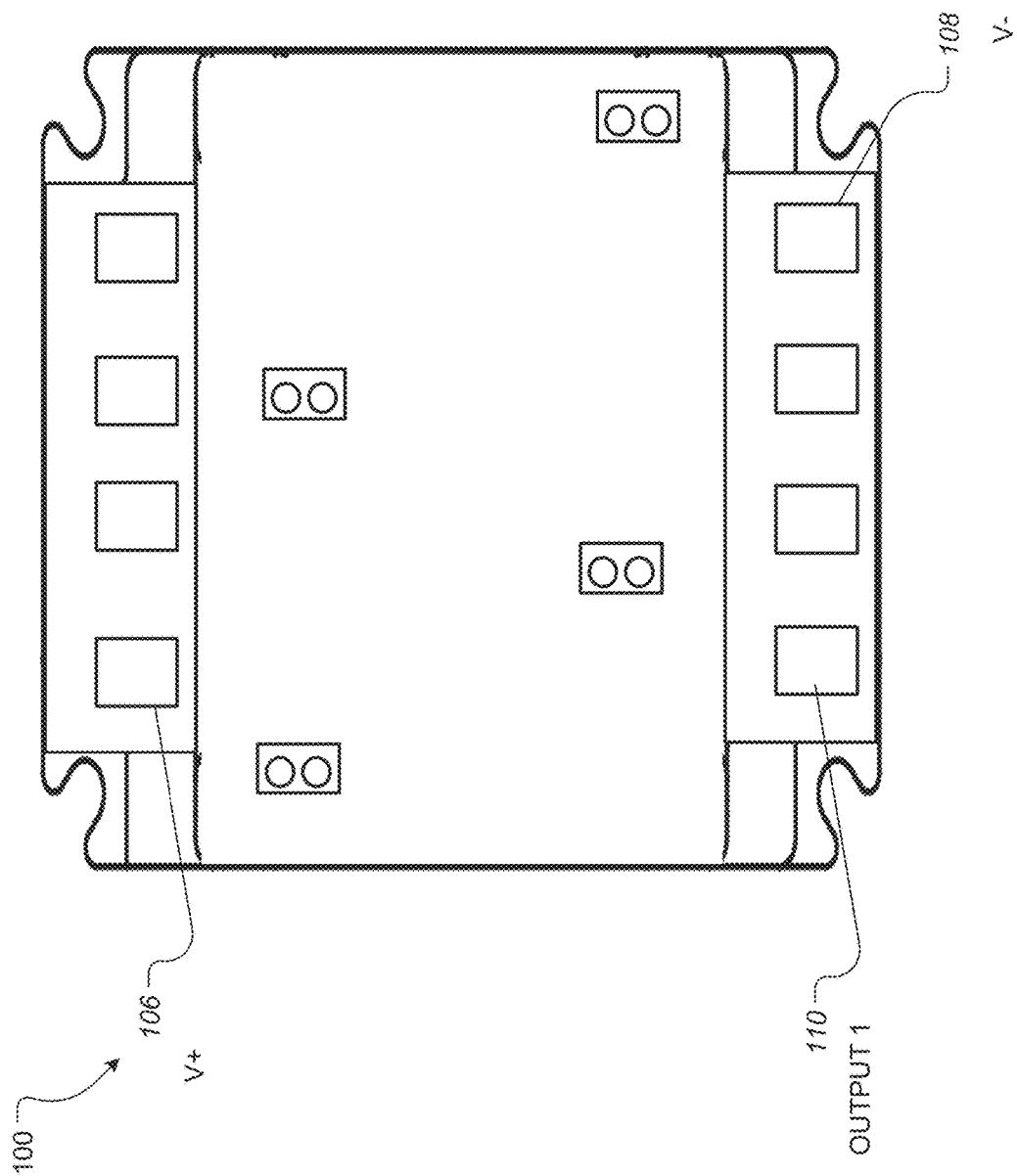
FIG. 9 illustrates a single power module having a full bridge configuration according to aspects of the disclosure.

FIG. 7 illustrates power modules in a full bridge configuration according to aspects of the disclosure; FIG. 8 illustrates a power module in a three-phase configuration according to aspects of the disclosure; and FIG. 9 illustrates a single power module having a full bridge configuration according to aspects of the disclosure. In some aspects, modularity may also be found in the formation of various electrical topologies, such as FIG. 7 for a full-bridge configuration of two of the power modules 100 and FIG. 8 for a three-phase configuration of three of the power modules 100. For these topologies, the first terminal 106 may function as the V+ terminal, the second terminal 108 may function as V− terminal and may be interconnected while the phase output terminals implemented by the third terminal 110 may remain separate. The configuration of FIG. 7 and FIG. 8 may also be placed in a single housing and may be configured with a shared base plate as illustrated in FIG. 9, which may increase power density with the possible tradeoff of higher unit complexity and cost.

While the various arrangements, configurations, and scaled width versions of the power module 100 cover a range of applications and power levels, the core internal components and layouts may remain identical, may match, may be duplicated, and/or the like. This reinforces the beneficial modular nature of the disclosed power module 100. This structure encompasses a family of modules showcasing a high level of performance while being easy to use and to grow with a range of customer specific systems.

Figure 10:
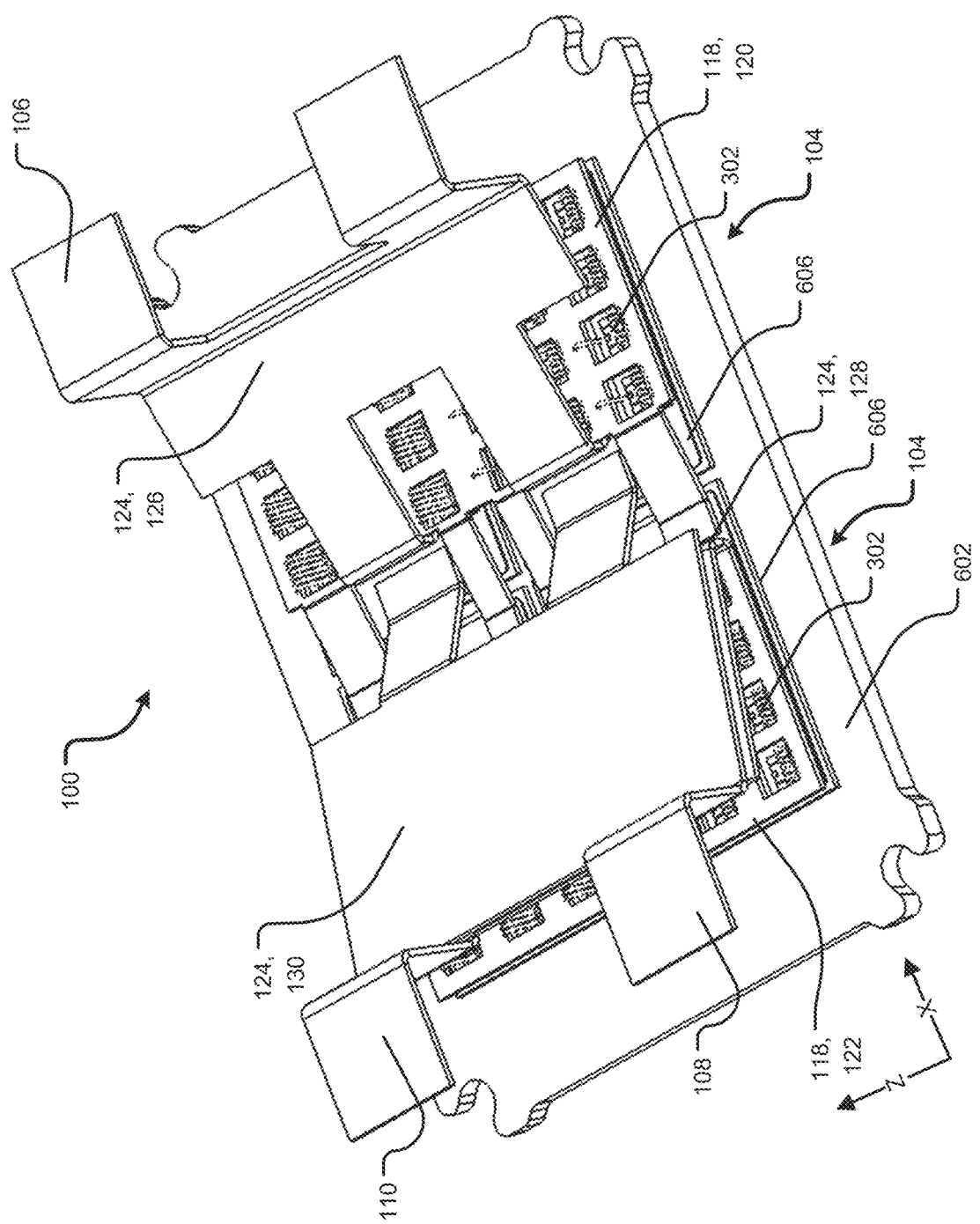
FIG. 10 illustrates a partial perspective internal view of the power module according to aspects of the disclosure.

FIG. 10 illustrates a partial perspective internal view of the power module according to aspects of the disclosure.

Figure 11:
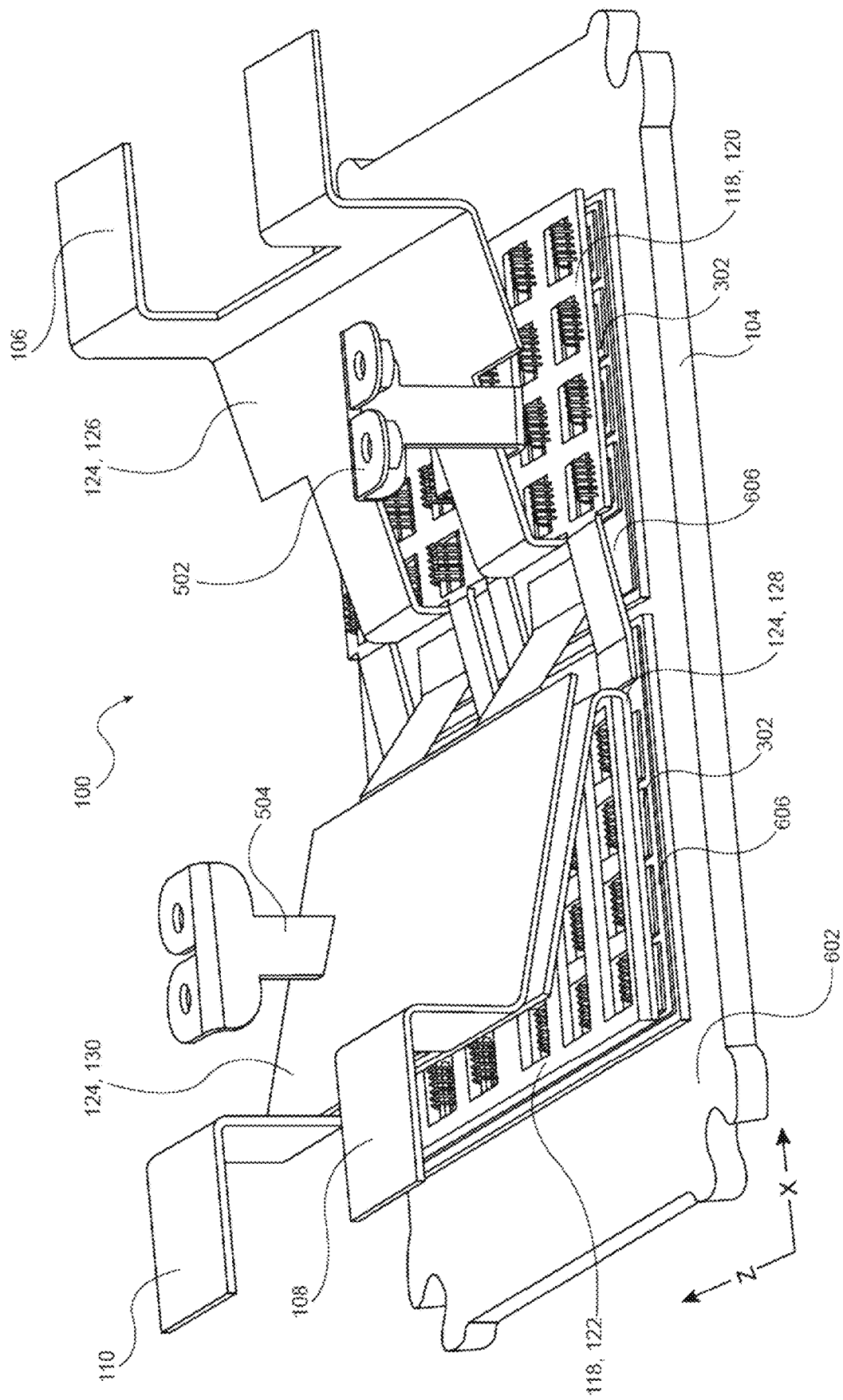
FIG. 11 illustrates a partial perspective internal view of the power module of FIG. 10.

FIG. 11 illustrates a partial perspective internal view of the power module of FIG. 10.

Figure 12:
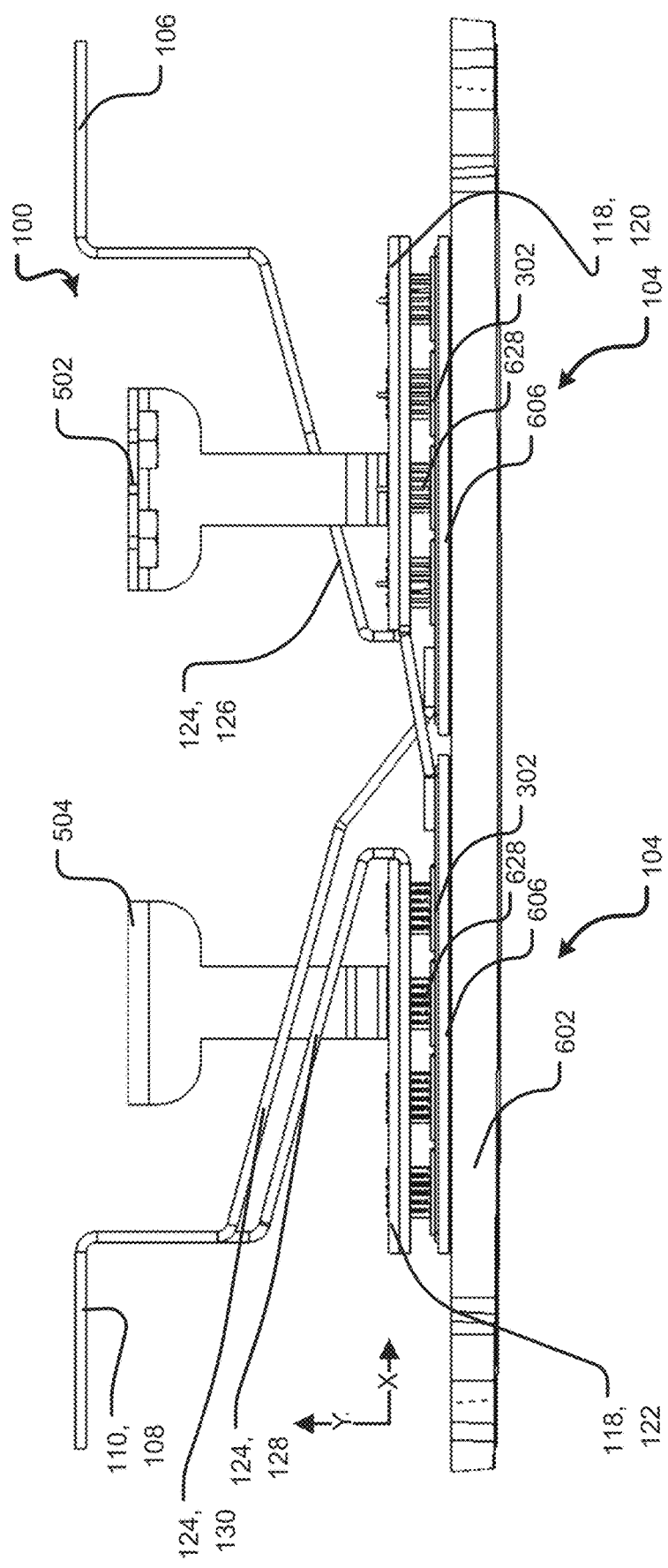
FIG. 12 illustrates a partial side view of the power module of FIG. 11.

FIG. 12 illustrates a partial side view of the power module of FIG. 11.

In particular, FIG. 10 illustrates a number of internal elements in the power module 100. The internal elements of the power module 100 may include one or more of a base plate 602, one or more power substrates 606, the first terminal 106, the second terminal 108, the third terminal 110, one or more switch positions 104, the power devices 302, the signal terminals 502, 504, and/or the like. Moreover, it is contemplated that the power module 100 may include more, fewer, or different elements than those described herein.

Additionally, the power module 100 may include at least one elevated signal element 118 and/or at least one elevated power plane 124. In particular, the power module 100 may include implementations that include the at least one elevated signal element 118 without an implementation of the at least one elevated power plane 124; the power module 100 may include implementations that include the at least one elevated power plane 124 without an implementation of the at least one elevated signal element 118; and the power module 100 may include implementations that include the at least one elevated signal element 118 and the at least one elevated power plane 124. Additionally, the power module 100 may include implementations that include the at least one elevated signal element 118 and the at least one elevated power plane 124 that may be separate structures, separate connected structures, separate directly connected structures, combined structures, and/or integrated structures.

In particular, the at least one elevated signal element 118 may include a first elevated signal element 120 and a second elevated signal element 122. However, the at least one elevated signal element 118 may include any number of elevated signal elements. In one aspect, the first elevated signal element 120 may be arranged above a first one of the one or more power substrates 606 and/or a first one of the switch positions 104; and the second elevated signal element 122 may be arranged above a second one of the one or more power substrates 606 and/or a second one of the switch positions 104. It should be noted that the relative term "above" as used herein describes a relationship of one element to another element as illustrated in the figures. It will be understood that the relative term "above" is intended to encompass different positions and/or orientations of the elements in addition to the positions and/or orientations depicted in the figures. In this regard, the relative term "above" as used herein may describe a vertical arrangement, a vertical offset, a relative vertical positioning, a spatial arrangement, a spatial offset, a relative spatial positioning, and/or the like of the elements that may not be limited to the orientation depicted in the figures.

The at least one elevated power plane 124 may include a first elevated power plane 126, a second elevated power plane 128, and a third elevated power plane 130. However, the at least one elevated power plane 124 may include any number of elevated power planes. In one aspect, the first elevated power plane 126 may be arranged above the first one of one or more power substrates 606 and/or the first one of the switch positions 104; and the second elevated power plane 128 may be arranged above the second one of one or more power substrates 606 and/or the second one of the switch positions 104. In one aspect, the at least one elevated power plane 124 may include insulating materials, insulating layers, and/or the like. In one aspect, the at least one elevated power plane 124 may be formed of at least one planar structure that extends the majority of the distance of a width of the power module 100 along the z-axis. In particular aspects, the at least one elevated power plane 124 may be formed of at least one planar structure that extends 60%-100%, 60%-70%, 70%-80%, 80%-90%, and/or 90%-100% of the distance of a width of the power module 100 along the z-axis.

In this regard, by placing the at least one elevated power plane 124 and the at least one elevated signal element 118 above the power devices 302, area may be freed up on the power substrates 606 to add more power devices, additional components (e.g., thermal sensors, current sensors, capacitors, etc.), larger metal planes to carry more current, easier layout geometries, more flexibility on where parts are placed, and/or the like resulting in a higher density power module package for the power module 100.

The at least one elevated signal element 118 may be implemented using a standard printed circuit board (PCB), a stiffer insulated metal substrate (IMS) technology, other variations for high-voltage prototype modules, and/or the like. For example, other variations for high-voltage prototype modules may be implemented primarily for voltage isolation reasons to make the substrate layout simpler, allow for a higher power density module, and/or the like the like. In one aspect, the at least one elevated signal element 118 may include insulating materials, insulating layers, and/or the like.

An integration of the at least one elevated signal element 118 and the at least one elevated power plane 124 further simplifies a geometry of the conducting plane on top of the power substrates 606. This integration allows for more design flexibility in routing power and signal paths to the power devices 302. In addition, in an embodiment using an IMS configuration or similar technology, where the signal paths are practically printed or laminated directly onto the at least one elevated power plane 124 can reduce overall part count and assembly complexity (and in some cases, reduces cost). Effectively, introducing an additional layer of metal into the power module 100 can also increase the overall ampacity of the power module 100.

The added range of choice in signal and power path routing with the at least one elevated signal element 118 and the at least one elevated power plane 124 of the disclosure coupled with a greater range of choice for device layout/location can have added benefits in terms of allowing a lower device density or positioning for better thermal performance and for lower package inductances.

In the case of lowering package inductance, the layered planar geometry of the at least one elevated power plane 124 above the power substrates 606 provides a near ideal low inductance loop geometry (small conductor separation, short total path, and wide current path).

More specifically, the disclosure uses the at least one elevated power plane 124 and/or the at least one elevated signal element 118 as conducting plane(s), on a separate level elevated above the base plate 602 and/or the power substrates 606 to isolate the base plate 602 from the rest of the power module 100, to route either signal and/or power conduction.

The at least one elevated signal element 118 and the at least one elevated power plane 124 may be implemented with a "hoverboard" or "lifted" or "elevated" configuration or approach, which helps solve the problem of limited/finite area of the base plate 602 and/or the power substrates 606 for placing additional power devices, sensors, connectors, conductive power and signal paths, and so on by moving some of that functionality onto another elevated plane (i.e., from 2-D to 3-D) utilizing the at least one elevated signal element 118 and/or the at least one elevated power plane 124 within the power module 100.

One aspect of the disclosure may include a power module 100 where the drain sides of the power devices 302 are connected electrically to a metallization of the power substrates 606 upon which the power devices 302 are mounted. Power connections 628 may be connected up to a layer of metal implemented by the at least one elevated power plane 124, for example, through square holes in the at least one elevated power plane 124 above the power devices 302, which is in turn may be connected to (and perhaps may even be the same piece of metal as) the first terminal 106, the second terminal 108, or the third terminal 110 of the power module 100.

One aspect of the disclosure may include the power module 100 implementing the at least one elevated signal element 118 above, vertically offset, on, directly on, below, directly below, spatially offset, and/or the like the at least one elevated power plane 124. One aspect of the disclosure may include the power module 100 implementing the at least one elevated signal element 118 with and/or on at least one side a printed circuit board (PCB) element resting atop the at least one elevated power plane 124.

One aspect of the disclosure may include an integrated version of the at least one elevated signal element 118 and the at least one elevated power plane 124. The integrated version of the at least one elevated signal element 118 may be an embodiment where the circuit board layer may be reduced to a thick film or printed or laminated structure (such as an insulated metal substrate (IMS)) where the insulating and conducting layers of the circuit board are made, laid down, printed directly to a surface of the at least one elevated power plane 124. In the case of an IMS implementation, this may result in a single purchased part which would integrate the power and signal layers of the at least one elevated signal element 118 and the at least one elevated power plane 124 all in one. It would be positioned within the power module 100, then both signal connections 626 and the power connections 628 may be connected to the integrated configuration of the at least one elevated signal element 118 and the at least one elevated power plane 124.

It should be noted that the at least one elevated signal element 118 may implement the IMS bottom metal layer, which is usually aluminum or copper, and which is normally used as the baseplate and is thus at ground potential. However, in aspects of the disclosure the at least one elevated signal element 118 may implement the IMS bottom metal layer in a novel way—as a high-current conductor and/or as a carrier of the Gate-Kelvin auxiliary terminal distribution network.

In one aspect, the power module 100 may implement the at least one elevated signal element 118 that may be layered onto a thick metal conductive power plane implementation of the at least one elevated power plane 124. This represents a way of routing the auxiliary control and/or sensing signals of the power module 100 on yet another conducting plane (or possibly multiple conducting planes) that may include the at least one elevated signal element 118 and/or the at least one elevated power plane 124. The at least one elevated signal element 118 may be mounted above the at least one elevated power plane 124 for ease in making wire bond electrical connections, but it is also possible if one or more advantages to that orientation are found. An "integrated version" of the signal planes (i.e., one over the high-side and low-side switch positions) would be an embodiment wherein the at least one elevated signal element 118 may be implemented as a thick film, printed, and/or laminated structure (e.g., such as an Insulated Metal Substrate (IMS) circuit board technology) where the insulating and conducting layers of the circuit board of the at least one elevated signal element 118 are made/laid down/printed/adhered/placed directly into or onto the at least one elevated power plane 124. In the case of an IMS embodiment, this may result in a single purchased part, which may integrate the power and signal and/or control layers all in one. In one aspect, it may be physically positioned within the module first before placing both the power and signal wire bonds. Subsequently, the resulting structure may be encapsulated, lidded, end-of-line tested, and/or the like.

The integration of 1) an elevated implementation of the at least one elevated signal element 118; and 2) an elevated implementation of the at least one elevated power plane 124 simplifies the geometry, trace density, and increases the utilization of the original top conducting ceramic substrate plane. This integration would essentially depopulate/remove previously existing low-power and high-power elements from the top metallization plane enabling increased "real estate" for more power semiconductors (i.e., SiC MOSFETs, SiC Junction Barrier Schottky (JBS) diodes, SiC IGBTs, Si power MOSFETs, Si IGBTs, etc.). This would, in theory, allow increased ampacity for the same substrate footprint or allow the integration of other application circuits (e.g., temperature sensors, current sensors, etc.) This integration also allows the module designer more design flexibility in routing power and signal paths to the power semiconductor devices since adding one additional dimension (i.e., moving from 2-D to 3-D) enables additional design degrees of freedom.

In addition, in an embodiment of the at least one elevated signal element 118 using an IMS circuit board or like technology where the signal paths are printed or laminated directly into or onto the power conductor, an overall part count, assembly complexity, and cost may be reduced.

An opportunity also exists to place passive devices—such as gate or source resistors, capacitors, and/or the like—within some power modules utilizing an internal gate-source-Kelvin (GSK) printed circuit board implementation of the at least one elevated signal element 118. Integrating that low-power signal distribution circuit in the at least one elevated signal element 118 directly with a high-power conducting plane of the at least one elevated power plane 124 provides the opportunity to easily locate and connect sensors—such as temperature sensors or current sensors that otherwise either may not fit or be easily connected. Since the signal layers of the at least one elevated signal element 118 now lie directly above the at least one elevated power plane 124, it is much simpler to place and connect to an inductive, Hall Effect, and/or resistive shunt current sensor mounted directly around, on, or very near the at least one elevated power plane 124.

In the case of a thermal sensor, these usually are placed directly on the top of the metallized ceramic substrate nearest the hottest power devices to sense the maximum temperature within the power module. This usually necessitates a list of design compromises due to incompatible voltages, sensor sizes, and connection routing paths. Having the integrated circuitry can greatly simplify the connection complexity either by reducing needed wire bond lengths or signal path space taken up on the power substrate, or by having the sensor mounted directly on the integrated circuit layer in a location closely coupled thermally to the heat-generating power devices (such as where the lifted power plane is connected to the substrate).

An important thing to note about the integrated signal layers of the at least one elevated signal element 118 is that some implementations of the disclosure allow for the signal layers to be bent out of plane either as a separate but connected element (like a flexible ribbon cable to make connection to other inner parts of or fed to components outside of the power module) or along bends made in the underlying power plane metal. Unlike the use of a standard planar circuit board, this flexibility allows for a much greater range of design options when it comes to routing and connecting either internal signal paths or to make external connections to gate driver boards for instance.

Lastly, applying some forethought to exactly when in the assembly process those bends are made, passive components (e.g., resistors, sensors, sockets, pins, blades, etc.) can be placed on the circuit of the at least one elevated signal element 118 and processed in bulk just as standard printed circuit boards and their components are populated in a highly automated way. This assembly step could possibly be outsourced to a standard board house at a very low cost and then bends could be added before or during final assembly.

The at least one elevated signal element 118 may be a small signal circuit board facilitating electrical connection from signal contacts, the signal terminals 502, the signal terminals 504, and/or the like to the power devices 302. The at least one elevated signal element 118 may allow for gate and source kelvin connection, as well as connection to additional nodes or internal sensing elements.

The at least one elevated signal element 118 may allow for individual gate resistors for each of the power devices 302. The at least one elevated signal element 118 may be a printed circuit board, a ceramic circuit board, a flex circuit board, embedded metal strips, and/or the like arranged in the power module 100. In one aspect, the at least one elevated signal element 118 may include a plurality assemblies. In one aspect, the at least one elevated signal element 118 may include a plurality assemblies, one for each switch position 104.

The at least one elevated power plane 124 may connect or be part of one of the first terminal 106, the second terminal 108, and/or the third terminal 110. In particular, each of the first terminal 106, the second terminal 108, and/or the third terminal 110 may connect and/or be part of a respective one of the at least one elevated power plane 124. In this regard, a respective one of the at least one elevated power plane 124 together with a respective one of the first terminal 106, the second terminal 108, and/or the third terminal 110 may create a high current path between an external system and the one or more power substrates 606. In one aspect, the first terminal 106 may connect or be part of the first elevated power plane 126, the second terminal 108 may be connected or be part of the second elevated power plane 128, and the third terminal 110 may be connected or be part of the third elevated power plane 130.

The at least one elevated power plane 124 and a respective one of the first terminal 106, the second terminal 108, and/or the third terminal 110 may be fabricated from sheet metal through an etching process, a stamping operation, and/or the like. In one aspect, the at least one elevated power plane 124 together with a respective one of the first terminal 106, the second terminal 108, and/or the third terminal 110 may be soldered, ultrasonically welded, or the like directly to the power substrate 606. The at least one elevated power plane 124 may have a metal plating, such as nickel, silver, gold, and/or the like to protect the surfaces and improve solderability.

The at least one elevated signal element 118 may be implemented at least in part as a thick film isolation. The at least one elevated signal element 118 implemented as a thick film isolation may utilize a printed thick film dielectric directly on the at least one elevated power plane 124 and may provide voltage blocking. The signal connections 626 may be attached to the thick film isolation of the at least one elevated signal element 118 through an epoxy, directly soldered to a thin layer of metal thick film printed on top of the dielectric film, or the like.

In other aspects, the at least one elevated signal element 118 may include suspension isolation. In this aspect, the at least one elevated signal element 118 may be suspended a sufficient distance over the at least one elevated power plane 124 and attached to a housing of the power module 100. In this regard, gel encapsulation filling the power module 100 may provide dielectric isolation. The at least one elevated signal element 118 may be configured to provide gate control and sense signals, which may factor prominently into switching performance of the power module 100 and may be of particular importance in a paralleled switch position 104. The at least one elevated signal element 118 may be configured with signal loops that may be optimized in the power module 100 for high performance, robustness, and uniform current sharing. Similar to the power loops, the paths may be configured to be limited in length, wide in cross section, and the associated external components may be placed as physically close as possible to the signal terminals 502, 504.

For a paralleled array of power devices 302 such as transistors, particularly MOSFETs, the timing and magnitude of the gate currents must be balanced to result in consistent turn-on and turn-off conditions. The at least one elevated signal element 118 of the power module 100 may utilize individual ballasting resistors that may be placed in close proximity to the gate of the power devices 302, only separated by the gate wire bond, such the signal connections 626. These components may be of a low resistance and aid in buffering a current flowing to each individual ones of the power devices 302. These components act to decouple the gates of the power devices 302, preventing oscillations and helping to ensure an equalized turn on signal for the paralleled configurations of the power devices 302. A singular external resistor may be utilized and connected to these paralleled resistors for controlling the turn on speed of the switch position 104.

The at least one elevated signal element 118 may implement the gate resistors in a number of different ways including a surface mount package, an integrated thick film layer, a printed thick film, a wire bondable chip, and/or the like depending on the application.

In particular, the at least one elevated signal element 118 may be arranged on the at least one elevated power plane 124. The at least one elevated signal element 118 may be connected to the signal terminals 502, 504. These connections may be used for temperature measurement or other forms of internal sensing. In some aspects, the internal sensing may include diagnostic sensing that includes diagnostic signals that may be generated from diagnostic sensors that may include strain gauges sensing vibration, sensors sensing humidity, and the like. Moreover, the diagnostic sensors may sense any environmental or device characteristic.

This implementation of this signal loop or the at least one elevated signal element 118 may be implemented in any combination of paralleled configurations of the power devices 302 in the switch position 104. Standard PCB board-to-board connectors may allow for a straightforward connection to external gate driver and control circuitry.

The power module 100 may include the base plate 602. In one aspect, the base plate 602 may include a metal. In one aspect, the metal may include copper. The base plate 602 may provide structural support to the power module 100 as well as facilitating heat spreading for thermal management of the power module 100. The base plate 602 may include a base metal, such as copper, aluminum, or the like, or a metal matrix composite (MMC) which may provide coefficient of thermal expansion (CTE) matching to reduce thermally generated stress. In one aspect, the MMC material may be a composite of a high conductivity metal such as copper, aluminum, and the like, and either a low CTE metal such as molybdenum, beryllium, tungsten, and/or a nonmetal such as diamond, silicon carbide, beryllium oxide, graphite, embedded pyrolytic graphite, or the like. Depending on the material, the base plate 602 may be formed by machining, casting, stamping, or the like. The base plate 602 may have a metal plating, such as nickel, silver, gold and/or the like, to protect surfaces of the base plate 602 and improve solder-ability. In one aspect, the base plate 602 may have a flat backside. In one aspect, the base plate 602 may have a convex profile to improve planarity after reflow. In one aspect, the base plate 602 may have pin fins for direct cooling. In one aspect, the base plate 602 may include insulating materials, insulating layers, and/or the like.

The power module 100 may include one or more power substrates 606. The one or more power substrates 606 may provide electrical interconnection, voltage isolation, heat transfer, and the like for the power devices 302. The one or more power substrates 606 may be constructed as a direct bond copper (DBC), an active metal braze (AMB), an insulated metal substrate (IMS), or the like. In the case of the IMS structure, the one or more power substrates 606 and the base plate 602 may be integrated as the same element. In some aspects, the one or more power substrates 606 may be attached to the base plate 602 with solder, thermally conductive epoxy, sintering or the like. In one aspect there may be two of the power substrates 606, one for each switch position 104. In one aspect, the power substrates 606 may include insulating materials, insulating layers, and/or the like. In one aspect, an electrically insulating layer that may also be highly thermally conductive may be utilized between the base plate 602 and the power substrates 606 that the power devices 302 are mechanically attached. Additionally, another electrically insulating material may surround the other components of the power module 100.

The power module 100 may include one or more power contacts. A surface of one of the one or more power contacts may form the first terminal 106, the second terminal 108, and/or the third terminal 110. The one or more power contacts may be implemented by the first terminal 106, the second terminal 108, and/or the third terminal 110 and may create a high current path between an external system and the one or more power substrates 606. The one or more edge power contacts implemented by the first terminal 106, the second terminal 108, and/or the third terminal 110 may be fabricated from sheet metal through an etching process, a stamping operation, and/or the like. In one aspect, the one or more edge power contacts implemented by the first terminal 106, the second terminal 108, and/or the third terminal 110 may be soldered, ultrasonically welded, and/or the like directly to the power substrate 606. The one or more power contacts implemented by the first terminal 106, the second terminal 108, and/or the third terminal 110 may have a metal plating, such as nickel, silver, gold, and/or the like to protect the surfaces and improve solder-ability.

With reference to FIG. 12, the power devices 302 may be located on the one or more power substrates 606. Additionally, the power devices 302 may include power connections 628 that connect the power devices 302 to the at least one elevated power plane 124. The upper pads on the power devices 302, including the gate and the source, may be wire bonded to their respective locations with the power connections 628 and/or the signal connections 626 to the at least one elevated signal element 118. The power connections 628 may include aluminum, an aluminum alloy, gold, copper, and/or the like materials implementing a wire construction, a ribbon construction, and/or the like, which may be ultrasonically welded, or the like at both feet, forming a conductive arch between two metal pads. The signal connections 626 may include aluminum, an aluminum alloy, gold, copper, and/or the like materials implementing a wire construction, a ribbon construction, and/or the like, which may be ultrasonically welded, or the like at both feet, forming a conductive arch between two metal pads.

Figure 13:
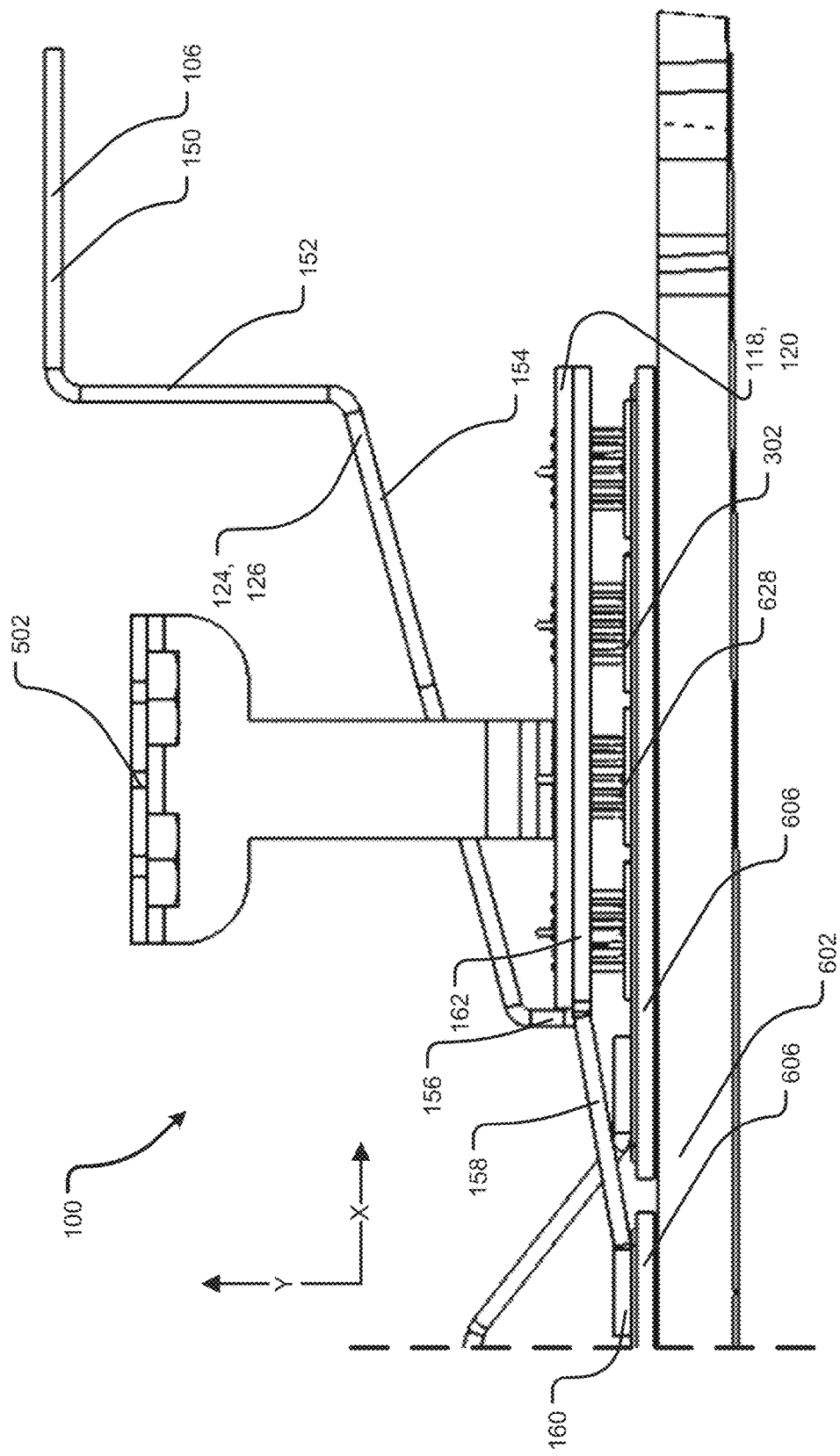
FIG. 13 illustrates a partial side view of the power module of FIG. 12.

FIG. 13 illustrates a partial side view of the power module of FIG. 12.

In particular, FIG. 13 illustrates details of the first elevated power plane 126. The first elevated power plane 126 may include the first terminal 106 and/or may connect to the first terminal 106. The first elevated power plane 126 may further include one or more of a first power plane portion 150, a second power plane portion 152, a third power plane portion 154, a fourth power plane portion 156, a fifth power plane portion 158, a sixth power plane portion 160, and a seventh power plane portion 162.

One or more of the first power plane portion 150, the second power plane portion 152, the third power plane portion 154, the fourth power plane portion 156, the fifth power plane portion 158, the sixth power plane portion 160, and the seventh power plane portion 162 may be connected with one or more connection portions which may be part of the first elevated power plane 126. One or more of the first power plane portion 150, the second power plane portion 152, the third power plane portion 154, the fourth power plane portion 156, the fifth power plane portion 158, the sixth power plane portion 160, and the seventh power plane portion 162 may create a high current path between an external system and the one or more power substrates 606 and/or the power devices 302, may be fabricated from sheet metal through an etching process, a stamping operation, and/or the like, and/or may have a metal plating, such as nickel, silver, gold, and/or the like to protect the surfaces and improve solder-ability.

The first power plane portion 150 may connect to or be part of the first terminal 106. The first power plane portion 150 may be generally horizontal or extend generally parallel to the X axis as illustrated in FIG. 13. Generally is defined herein as being within 10°.

The first power plane portion 150 may connect to the second power plane portion 152. In this regard, the connection may be a bend, a welded portion, a soldered portion, and/or the like. The second power plane portion 152 may be arranged generally vertically or generally parallel to the Y axis. Moreover, the second power plane portion 152 may be vertically below the first power plane portion 150 and/or the first terminal 106. The connection may form an angle between the two different elements. The angle may be 20° to 160°, 20° to 60°, 60° to 100°, 100° to 140°, or 140° to 160° between the two different elements. In particular aspects, the second power plane portion 152 may be formed of at least one planar structure that extends 60%-100%, 60%-70%, 70%-80%, 80%-90%, and/or 90%-100% of the distance of a width of the power module 100 along the z-axis.

The second power plane portion 152 may connect to the third power plane portion 154. In this regard, the connection may be a bend, a welded portion, a soldered portion, and/or the like. The third power plane portion 154 may be arranged at an angle with respect to the X axis, inclined with respect to the X axis, at an angle with respect to the y-axis, inclined with respect to the y-axis, and/or the like. Moreover, the third power plane portion 154 may be vertically below the second power plane portion 152, the first power plane portion 150, and/or the first terminal 106. The connection may form an angle between the two different elements. The angle may be 20° to 160°, 20° to 60°, 60° to 100°, 100° to 140°, or 140° to 160° between the two different elements. In particular aspects, the third power plane portion 154 may be formed of at least one planar structure that extends 60%-100%, 60%-70%, 70%-80%, 80%-90%, and/or 90%-100% of the distance of a width of the power module 100 along the z-axis.

The third power plane portion 154 may connect to the fourth power plane portion 156. In this regard, the connection may be a bend, a welded portion, a soldered portion, and/or the like. The fourth power plane portion 156 may be arranged generally vertically or generally parallel to the Y axis. Moreover, the fourth power plane portion 156 may be vertically below the first power plane portion 150, the second power plane portion 152, the third power plane portion 154, and/or the first terminal 106. The connection may form an angle between the two different elements. The angle may be 20° to 160°, 20° to 60°, 60° to 100°, 100° to 140°, or 140° to 160° between the two different elements. In particular aspects, the fourth power plane portion 156 may be formed of at least one planar structure that extends 60%-100%, 60%-70%, 70%-80%, 80%-90%, and/or 90%-100% of the distance of a width of the power module 100 along the z-axis.

The fifth power plane portion 158 may connect to the fourth power plane portion 156. In this regard, the connection may be a bend, a welded portion, a soldered portion, and/or the like. The fifth power plane portion 158 may be arranged at an angle with respect to the X axis, inclined with respect to the X axis, at an angle with respect to the y-axis, inclined with respect to the y-axis, and/or the like. Moreover, the fifth power plane portion 158 may be vertically below the fourth power plane portion 156, the third power plane portion 154, the second power plane portion 152, the first power plane portion 150, and/or the first terminal 106. The connection may form an angle between the two different elements. The angle may be 20° to 160°, 20° to 60°, 60° to 100°, 100° to 140°, or 140° to 160° between the two different elements.

The fifth power plane portion 158 may connect to the sixth power plane portion 160. In this regard, the connection may be a bend, a welded portion, a soldered portion, and/or the like. The sixth power plane portion 160 may be arranged generally parallel with the X axis, and/or generally parallel to an upper surface of the second the one or more power substrates 606. Moreover, the sixth power plane portion 160 may be vertically below the fifth power plane portion 158, the fourth power plane portion 156, the third power plane portion 154, the second power plane portion 152, the first power plane portion 150, and/or the first terminal 106. The connection may form an angle between the two different elements. The angle may be 20° to 160°, 20° to 60°, 60° to 100°, 100° to 140°, or 140° to 160° between the two different elements.

The sixth power plane portion 160 may connect to the one or more power substrates 606. In particular, the first power plane portion 150 may connect to the one or more power substrates 606 that is adjacent to the one or more power substrates 606 over which the seventh power plane portion 162 is positioned. In one aspect, the sixth power plane portion 160 may be split into feet to aid in the attach process to the one or more power substrates 606. The sixth power plane portion 160 may have a metal plating, such as nickel, silver, and/or gold to protect the surfaces and improve solder-ability.

The fourth power plane portion 156 may connect to the seventh power plane portion 162. In this regard, the connection may be a bend, a welded portion, a soldered portion, and/or the like. The seventh power plane portion 162 may be arranged generally parallel with the X axis and/or generally horizontal. Moreover, the seventh power plane portion 162 may be vertically below the fourth power plane portion 156, the third power plane portion 154, the second power plane portion 152, the first power plane portion 150, and/or the first terminal 106. The seventh power plane portion 162 may connect to the power connections 628. The power connections 628 may also connect to the power devices 302. The connection may form an angle between the two different elements. The angle may be 20° to 160°, 20° to 60°, 60° to 100°, 100° to 140°, or 140° to 160° between the two different elements.

As further shown in FIG. 13, the first elevated signal element 120 may be arranged above the seventh power plane portion 162 of the first elevated power plane 126. In one aspect, the first elevated signal element 120 may be arranged above and separated from the seventh power plane portion 162 of the first elevated power plane 126. In one aspect, the first elevated signal element 120 may be arranged above and on the seventh power plane portion 162 of the first elevated power plane 126. In one aspect, the first elevated signal element 120 may be arranged above and directly on the seventh power plane portion 162 of the first elevated power plane 126. However, in other aspects the first elevated signal element 120 may also be arranged below the seventh power plane portion 162. In particular aspects, the at least one elevated power plane 124 may be formed of at least one planar structure that extends 60%-100%, 60%-70%, 70%-80%, 80%-90%, and/or 90%-100% of the distance of a width of the power module 100 along the z-axis.

The power module 100 may further include one or more switch positions 104. The one or more switch positions 104 may include the power devices 302 that may include any combination of controllable switches and diodes placed in parallel to meet requirements for current, voltage, and efficiency. The power devices 302 may be attached with solder, conductive epoxy, a sintering material, or the like.

The upper pads on the power devices 302, including the gate and the source, may be wire bonded to their respective locations with the power connections 628 to a respective one of the at least one elevated power plane 124. The power connections 628 may include aluminum, an aluminum alloy, gold, copper, and/or the like materials implementing a wire construction, a ribbon construction, and/or the like, which may be ultrasonically welded, or the like at both feet, forming a conductive arch between two metal pads.

The signal connections 626 may include aluminum, an aluminum alloy, gold, copper, and/or the like materials implementing a wire construction, a ribbon construction, and/or the like, which may be ultrasonically welded, or the like at both feet, forming a conductive arch between two metal pads. In some aspects, a diameter of a wire of the signal connections 626 may be smaller than the wire of the power connections 628.

Figure 14:
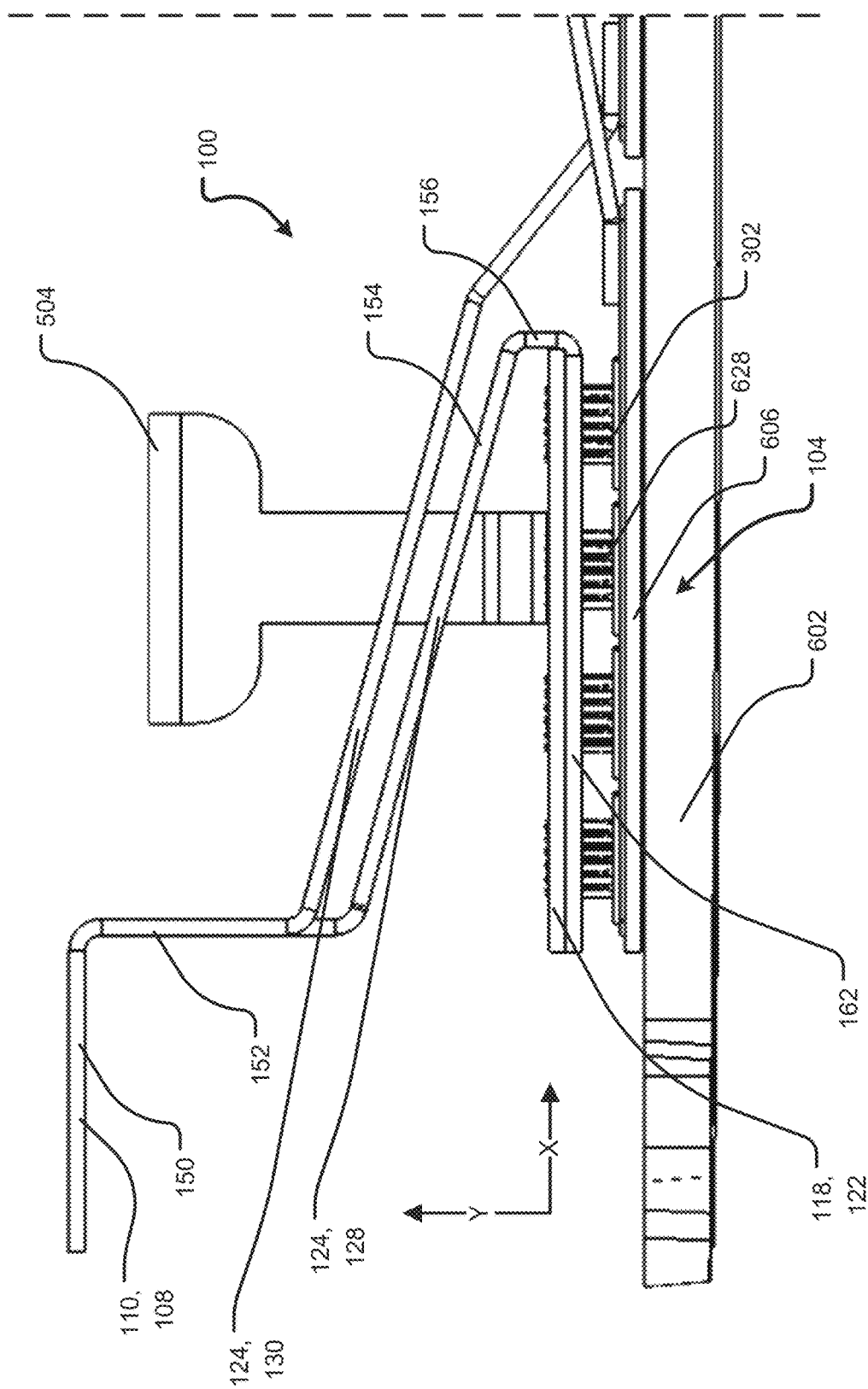
FIG. 14 illustrates a partial side view of the power module of FIG. 12.

FIG. 14 illustrates a partial side view of the power module of FIG. 12.

In particular, FIG. 14 illustrates details of the second elevated power plane 128. The second elevated power plane 128 may include the second terminal 108 and/or may connect to the second terminal 108. The second elevated power plane 128 may further include one or more of a first power plane portion 150, a second power plane portion 152, a third power plane portion 154, a fourth power plane portion 156, a fifth power plane portion 158, a sixth power plane portion 160, and a seventh power plane portion 162.

The configuration and operation of the second elevated power plane 128 implementing the first power plane portion 150, the second power plane portion 152, the third power plane portion 154, the fourth power plane portion 156, the fifth power plane portion 158, the sixth power plane portion 160, and the seventh power plane portion 162 may be consistent with the first elevated power plane 126 as described in conjunction with FIG. 13. However, some aspects of the second elevated power plane 128 may not include the fifth power plane portion 158 and/or the sixth power plane portion 160. However, in other aspects, the second elevated power plane 128 may include the fifth power plane portion 158 and/or the sixth power plane portion 160.

As further shown in FIG. 14, the second elevated signal element 122 may be arranged above the seventh power plane portion 162 of the second elevated power plane 128. In one aspect, the second elevated signal element 122 may be arranged above and separated from the seventh power plane portion 162 of the second elevated power plane 128. In one aspect, the second elevated signal element 122 may be arranged above and on the seventh power plane portion 162 of the second elevated power plane 128. In one aspect, the second elevated signal element 122 may be arranged above and directly on the seventh power plane portion 162 of the second elevated power plane 128. However, in other aspects the second elevated signal element 122 may also be arranged below the seventh power plane portion 162.

Figure 15:
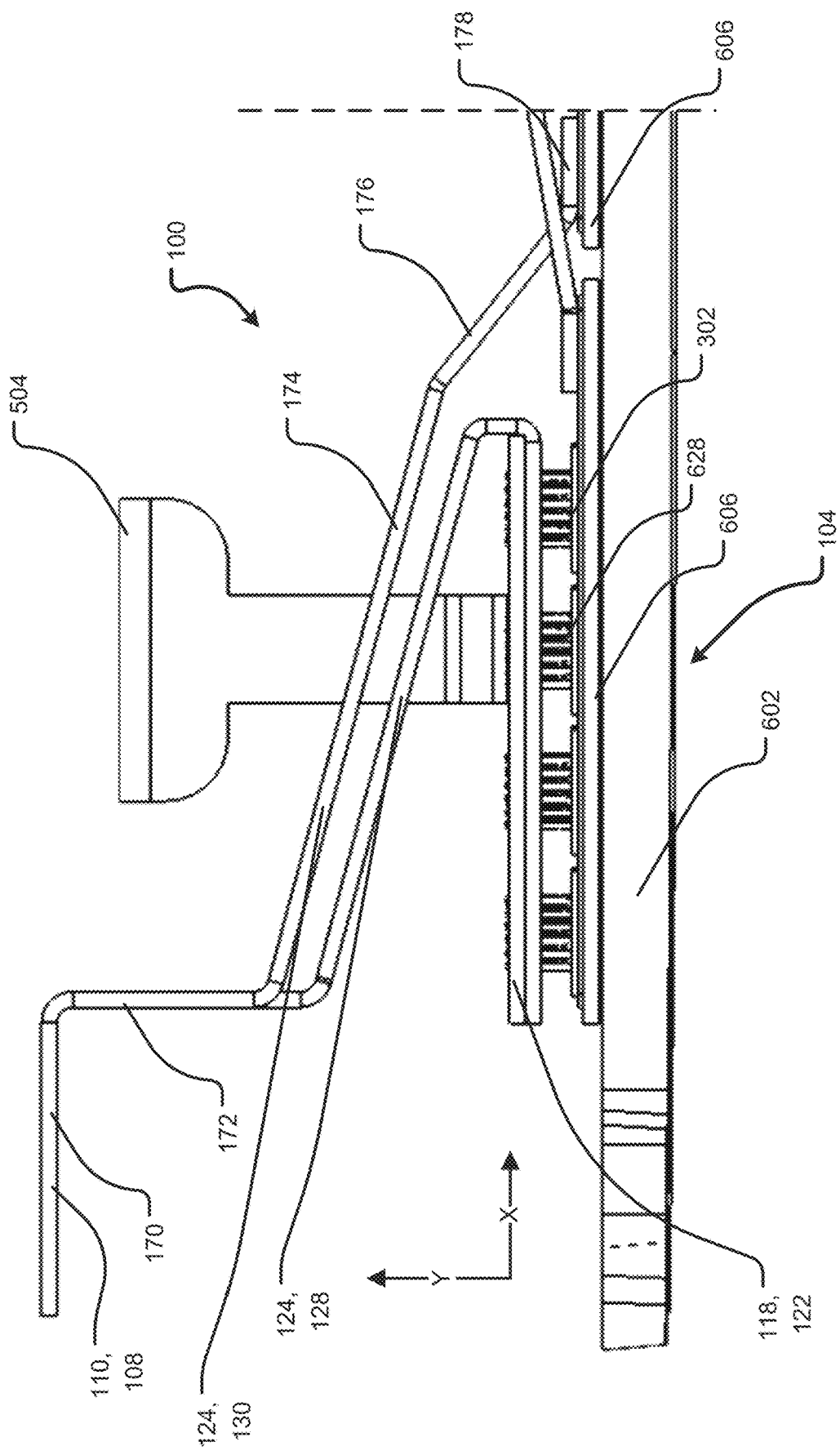
FIG. 15 illustrates a partial side view of the power module of FIG. 12.

FIG. 15 illustrates a partial side view of the power module of FIG. 12.

In particular, FIG. 15 illustrates details of the third elevated power plane 130. The third elevated power plane 130 may include the second terminal 108 and/or may connect to the second terminal 108. The third elevated power plane 130 may further include one or more of a first power plane portion 170, a second power plane portion 172, a third power plane portion 174, a fourth power plane portion 176, and a fifth power plane portion 178.

One or more of the first power plane portion 170, the second power plane portion 172, the third power plane portion 174, the fourth power plane portion 176, and the fifth power plane portion 178 may be connected with one or more connection portions which may be part of the third elevated power plane 130. One or more of the first power plane portion 170, the second power plane portion 172, the third power plane portion 174, the fourth power plane portion 176, and the fifth power plane portion 178 may create a high current path between an external system and the one or more power substrates 606 and/or the power devices 302, may be fabricated from sheet metal through an etching process, a stamping operation, and/or the like, and/or may have a metal plating, such as nickel, silver, gold, and/or the like to protect the surfaces and/or improve solder-ability.

The first power plane portion 170 may connect to or be part of the second terminal 108. The first power plane portion 170 may be generally horizontal or extend generally parallel to the X axis as illustrated in FIG. 15. Generally is defined herein as being within 10°.

The first power plane portion 170 may connect to the second power plane portion 172. In this regard, the connection may be a bend, a welded portion, a soldered portion, and/or the like. The second power plane portion 172 may be arranged generally vertically or generally parallel to the Y axis. Moreover, the second power plane portion 172 may be vertically below the first power plane portion 170 and/or the second terminal 108. The connection may form an angle between the two different elements. The angle may be 20° to 160°, 20° to 60°, 60° to 100°, 100° to 140°, or 140° to 160° between the two different elements.

The second power plane portion 172 may connect to the third power plane portion 174. In this regard, the connection may be a bend, a welded portion, a soldered portion, and/or the like. The third power plane portion 174 may be arranged at an angle with respect to the X axis, inclined with respect to the X axis, at an angle with respect to the y-axis, inclined with respect to the y-axis, and/or the like. Moreover, the third power plane portion 174 may be vertically below the second power plane portion 172, the first power plane portion 170, and/or the second terminal 108. The connection may form an angle between the two different elements. The angle may be 20° to 160°, 20° to 60°, 60° to 100°, 100° to 140°, or 140° to 160° between the two different elements. In particular aspects, the third power plane portion 174 may be formed of at least one planar structure that extends 60%-100%, 60%-70%, 70%-80%, 80%-90%, and/or 90%-100% of the distance of a width of the power module 100 along the z-axis.

The third power plane portion 174 may connect to the fourth power plane portion 176. In this regard, the connection may be a bend, a welded portion, a soldered portion, and/or the like. The fourth power plane portion 176 may be arranged at an angle with respect to the X axis, inclined with respect to the X axis, at an angle with respect to the y-axis, inclined with respect to the y-axis, and/or the like. Moreover, the fourth power plane portion 176 may be vertically below the third power plane portion 174, the second power plane portion 172, the first power plane portion 170, and/or the second terminal 108. The connection may form an angle between the two different elements. The angle may be 20° to 160°, 20° to 60°, 60° to 100°, 100° to 140°, or 140° to 160° between the two different elements.

The fourth power plane portion 176 may connect to the fifth power plane portion 178. In this regard, the connection may be a bend, a welded portion, a soldered portion, and/or the like. The fifth power plane portion 178 may be arranged generally parallel with the X axis, and/or generally parallel to an upper surface of the second the one or more power substrates 606. Moreover, the fifth power plane portion 178 may be vertically below the fourth power plane portion 176, the third power plane portion 174, the second power plane portion 172, the first power plane portion 170, and/or the second terminal 108. The connection may form an angle between the two different elements. The angle may be 20° to 160°, 20° to 60°, 60° to 100°, 100° to 140°, or 140° to 160° between the two different elements.

The fifth power plane portion 178 may connect to the one or more power substrates 606. In particular, the first power plane portion 170 may connect to the one or more power substrates 606 that is adjacent to the one or more power substrates 606 over which the first elevated power plane 126 is positioned. In one aspect, the fifth power plane portion 178 may be split into feet to aid in the attach process to the one or more power substrates 606. The fifth power plane portion 178 may have a metal plating, such as nickel, silver, and/or gold to protect the surfaces and improve solderability.

Figure 16:
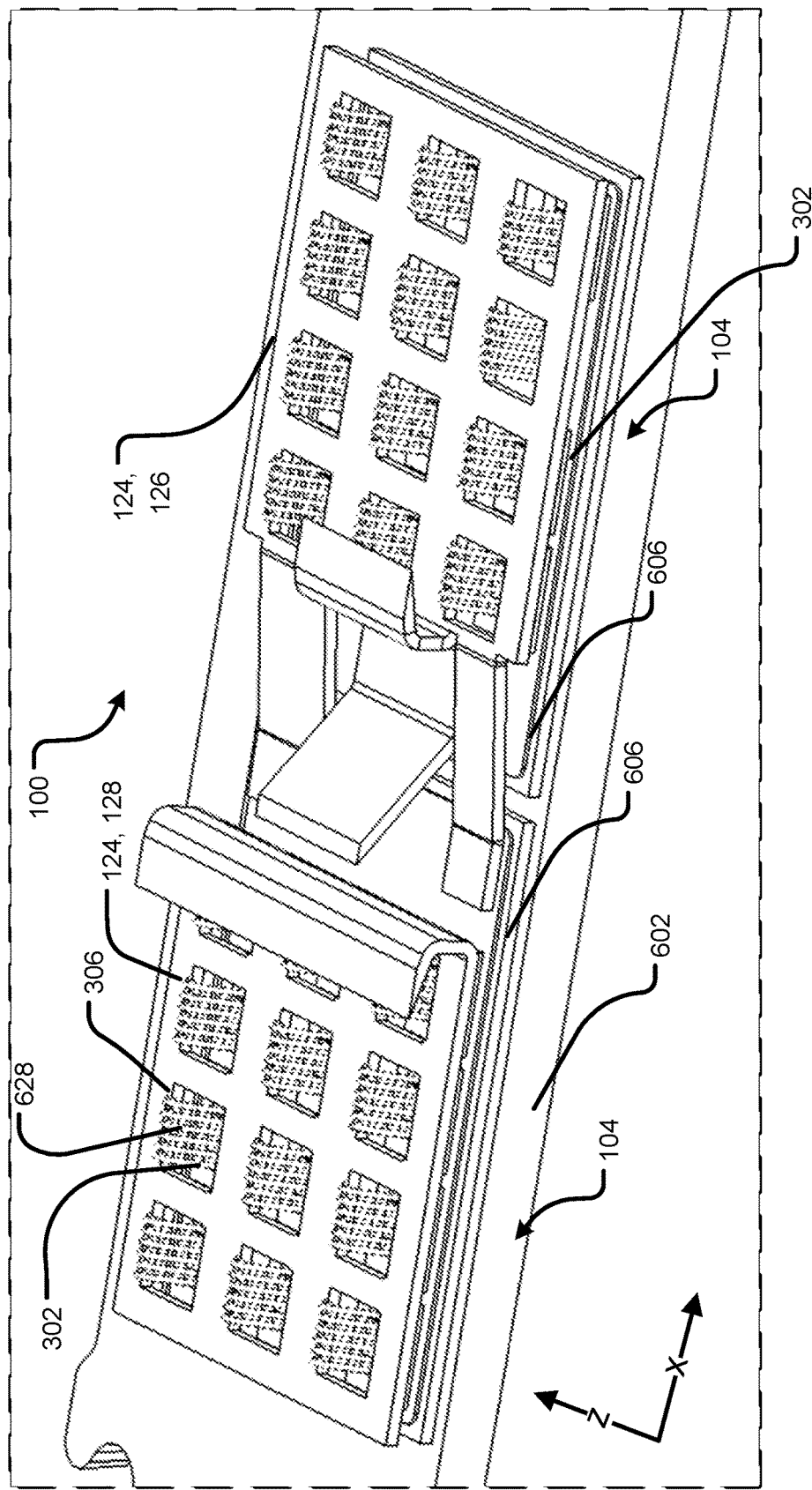
FIG. 16 illustrates a partial internal view of the power module of FIG. 10.

FIG. 16 illustrates a partial internal view of the power module of FIG. 10.

In particular, FIG. 16 illustrates an exemplary arrangement of the power devices 302 on one or more power substrates 606 of the power module 100. Moreover, FIG. 16 illustrates the arrangement of the first elevated power plane 126 over a first one of the one or more power substrates 606 and the power connections 628 extending from the power devices 302 to the second elevated power plane 128.

Additionally, the power module 100 may include a plurality of windows 306 that may be arranged in the second elevated power plane 128 and the first elevated power plane 126. In this regard, the plurality of windows 306 may be rounded, rectangular shaped, square-shaped, polygonal-shaped, and/or the like. In one aspect, for each of the power devices 302, there may be a respective one of the plurality of windows 306. In other aspects, more than one of the power devices 302 may be associated with a respective one of the plurality of windows 306. The plurality of windows 306 are configured to allow the power connections 628 to extend vertically upward from the power devices 302 to the second elevated power plane 128 and/or the first elevated power plane 126. The plurality of windows 306 are further configured to allow the signal connections 626 to extend vertically upward from the power devices 302 to the at least one elevated signal element 118, the second elevated signal element 122, and/or the first elevated signal element 120.

Additionally, the power module 100 may include a plurality of the power devices 302. In particular, for each of the one or more power substrates 606, there may be a plurality of rows of the power devices 302 extending along the X axis; and for each of the one or more power substrates 606, there may be a plurality of rows of the power devices 302 extending along the Y axis. As shown in FIG. 16, there may be four rows of the power devices 302 extending along the X axis; and for each of the one or more power substrates 606, there may be three rows of the power devices 302 extending along the Y axis. However, there may any number of rows of the power devices 302 extending along the X axis; and for each of the one or more power substrates 606, there may be any number of rows of the power devices 302 extending along the Y axis. This arrangement of the power devices 302 on the one or more power substrates 606 may be defined as an array of the power devices 302. Additionally, there is no requirement that the power devices 302 be arranged in a rectangular grid or array; the power devices 302 may be distributed about a surface of the one or more power substrates 606 in any arrangement which affords an advantage to a desired property such as heat distribution, power distribution, inductance balancing, and/or similar.

Figure 17:
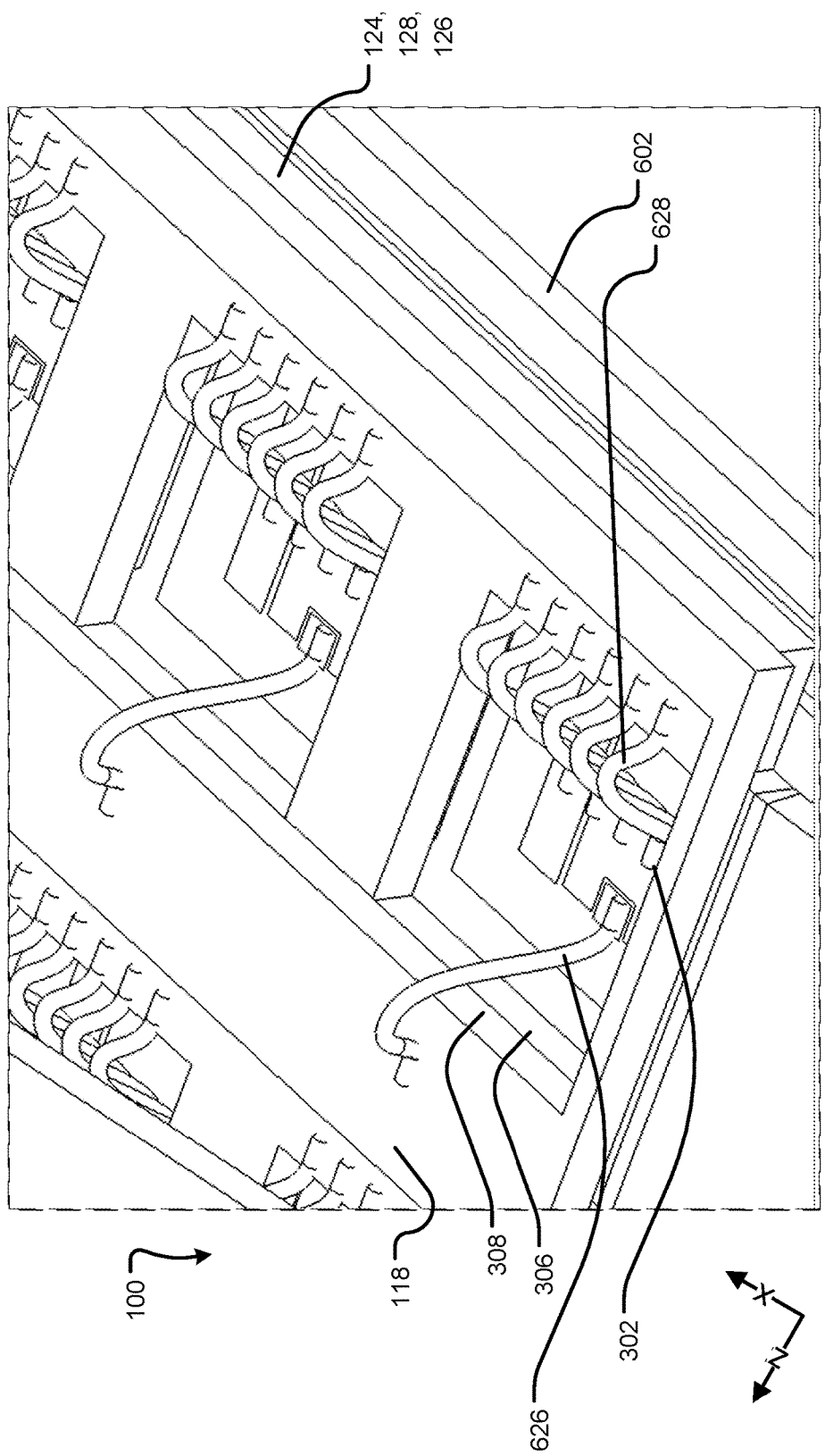
FIG. 17 illustrates a partial internal view of the power module of FIG. 10.

FIG. 17 illustrates a partial internal view of the power module of FIG. 10.

In particular, FIG. 17 illustrates in detail the arrangement of the power devices 302, the at least one elevated signal element 118, and the plurality of windows 306. In this regard, FIG. 17 illustrates the power connections 628 extending up from the power devices 302 through the plurality of windows 306 to connect to the second elevated power plane 128 of the at least one elevated power plane 124 and/or the first elevated power plane 126 of the at least one elevated power plane 124.

Additionally, the power module 100 may include a plurality of windows 308 that may be arranged in the at least one elevated signal element 118. In this regard, the plurality of windows 308 may be rounded, rectangular shaped, square-shaped, polygonal-shaped, and/or the like. In one aspect, for each of the power devices 302, there may be a respective one of the plurality of windows 308. In other aspects, more than one of the power devices 302 may be associated with a respective one of the plurality of windows 308. The plurality of windows 308 are configured to allow the signal connections 626 to extend vertically upward from the power devices 302 to the at least one elevated signal element 118. As illustrated in FIG. 17, more than one of the power devices 302 may be associated with a respective one of the plurality of windows 308.

Figure 18:
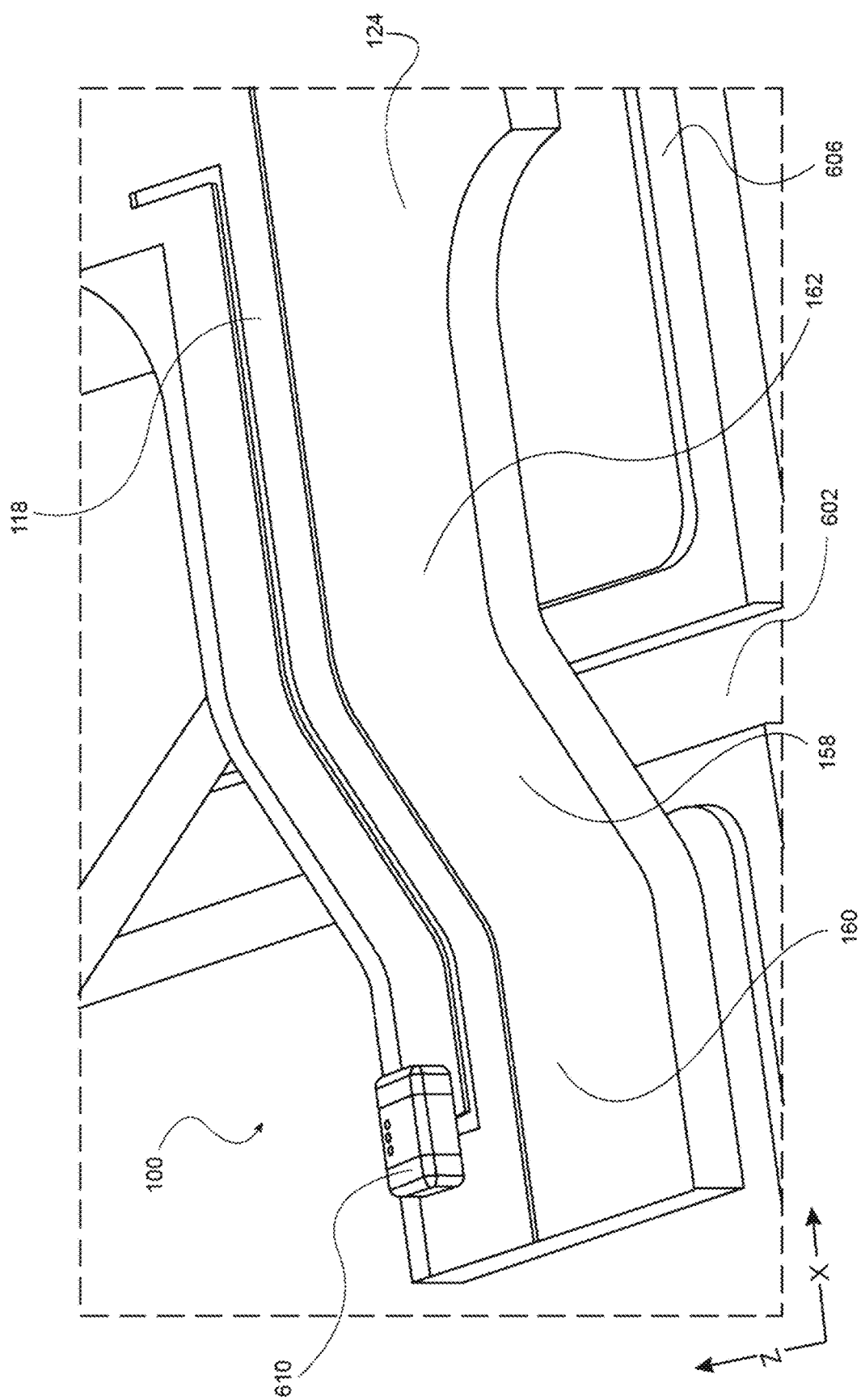
FIG. 18 illustrates a partial internal view of the power module of FIG. 10.

FIG. 18 illustrates a partial internal view of the power module of FIG. 10.

In particular, FIG. 18 illustrates that the power module 100 may further include one or more sensors 610. In particular, one or more sensors 610 may be arranged on or directly on the at least one elevated power plane 124. In some aspects, one or more sensors 610 may be arranged on the sixth power plane portion 160. The one or more sensors 610 may be attached with solder, conductive epoxy, a sintering material, and/or the like, to the at least one elevated power plane 124 and then may be connected to the at least one elevated signal element 118. In particular, one or more sensors 610 may be arranged on the fifth power plane portion 158 of the at least one elevated power plane 124. In certain aspects, the at least one elevated signal element 118 may be arranged on the at least one elevated power plane 124 and may be connected to the at least one elevated signal element 118.

In one aspect, one or more sensors 610 may be one or more temperature sensors and may be implemented with resistive temperature sensor elements and may be attached directly to the at least one elevated power plane 124. In particular, one or more sensors 610 may be arranged on or directly on the at least one elevated power plane 124. Other types of temperature sensors are contemplated as well including resistance temperature detectors (RDTs) type sensors, Negative Temperature Coefficient (NTC) type sensors, optical type sensors, thermistors, thermocouples, and the like.

Moreover, one or more sensors 610 may further include one or more diagnostic sensors that may include strain gauges sensing vibration, and the like. The diagnostic sensors can also determine humidity. Moreover, the diagnostic sensors may sense any environmental or device characteristic. One or more sensors 610 may additionally or alternatively be attached directly to the power substrate 606.

Figure 19:
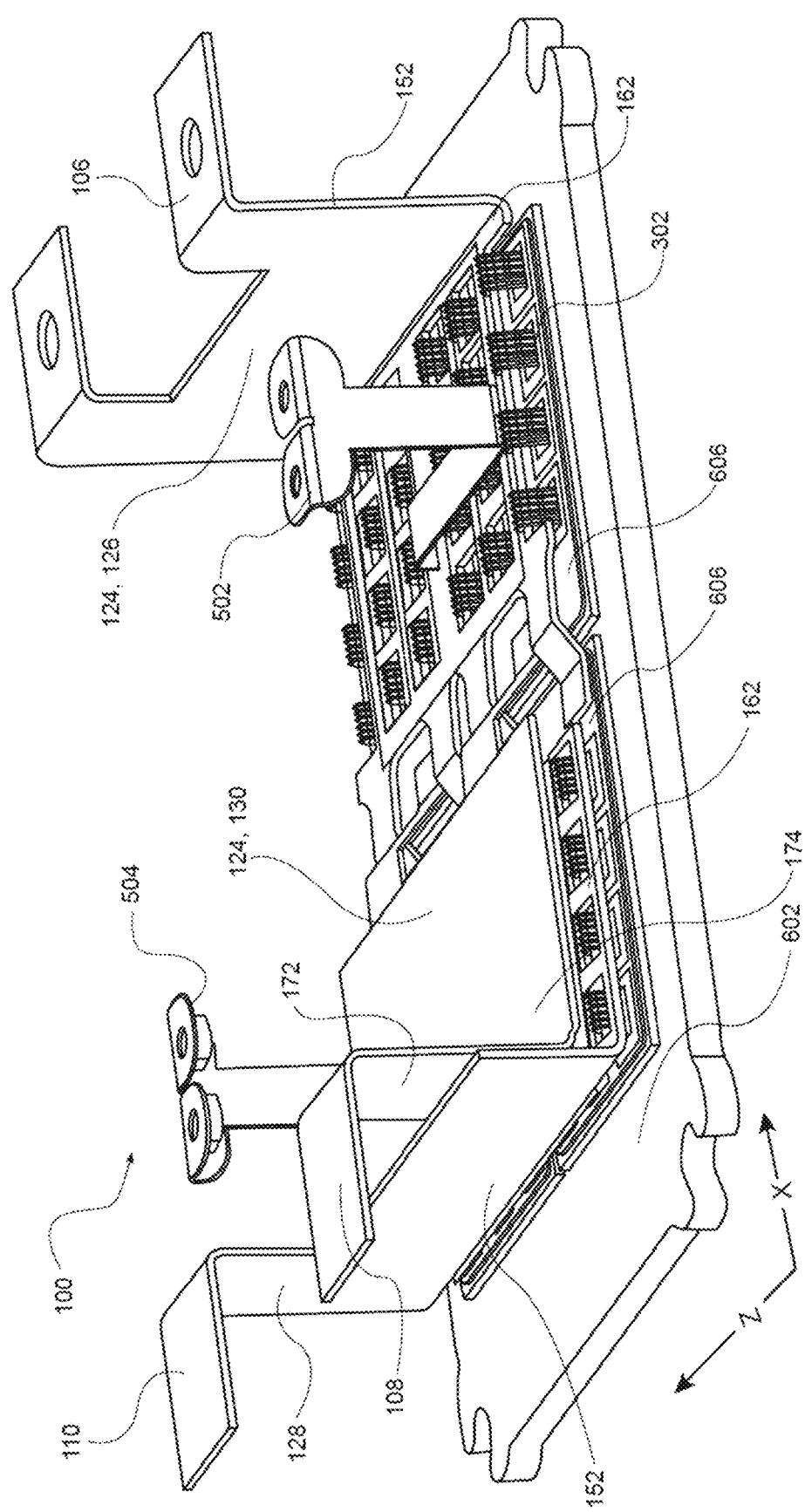
FIG. 19 illustrates a partial internal view of the power module according to aspects of the disclosure.

FIG. 19 illustrates a partial internal view of the power module according to aspects of the disclosure.

In particular, FIG. 19 illustrates another aspect of the power module 100. The aspect of FIG. 19 may include any one or more of the features of the disclosure. Additionally, FIG. 9 illustrates that the second power plane portion 152 of the first elevated power plane 126 may extend generally vertically down to the seventh power plane portion 162 and connect to the seventh power plane portion 162. Additionally, FIG. 9 illustrates that the second power plane portion 172 of the third elevated power plane 130 may extend vertically downward to the third power plane portion 174 and connect to the third power plane portion 174. Moreover, FIG. 9 illustrates that the second power plane portion 152 of the second elevated power plane 128 extend generally vertically downward to the seventh power plane portion 162 and connect to the seventh power plane portion 162.

Figure 20:
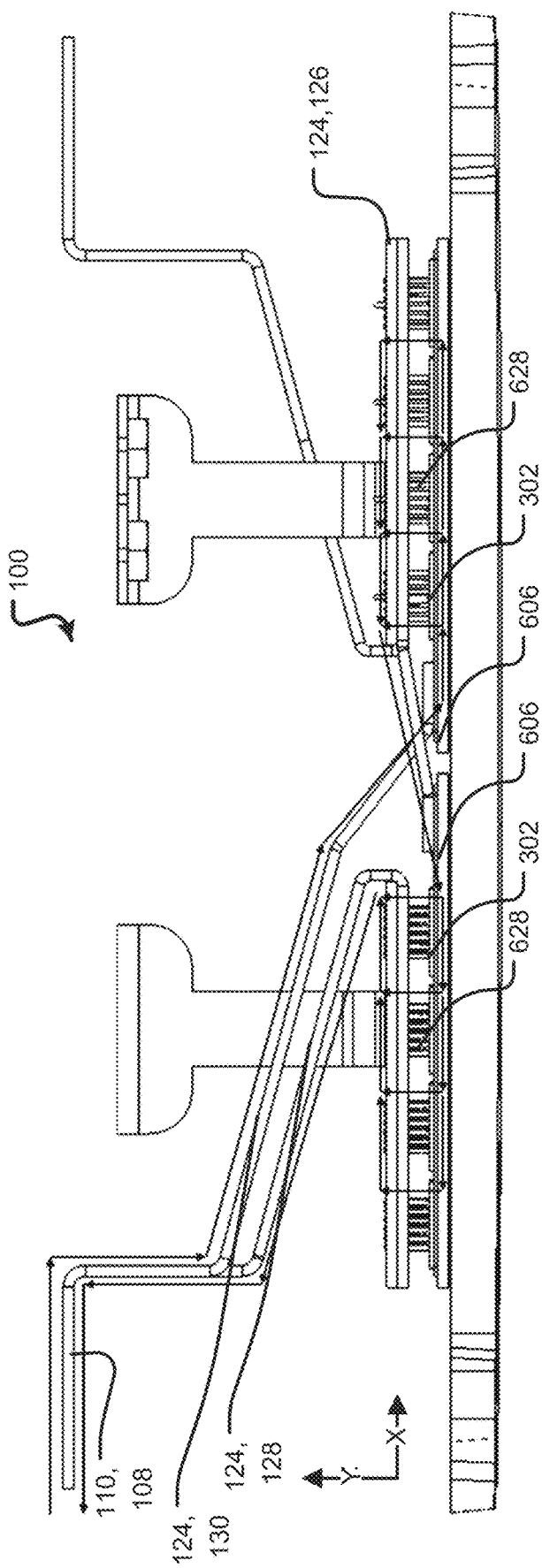
FIG. 20 illustrates current flow through the power module of FIG. 10.

FIG. 20 illustrates current flow through the power module of FIG. 10.

In particular, FIG. 20 illustrates an exemplary current flow through the power module 100 when the power devices 302 are accordingly controlled. In particular, the power devices 302 may be controlled for multiple variations of current flow through the power module 100. Accordingly, the flow of current illustrated in FIG. 20 is merely one of the many possible flows of current through the power module 100.

As illustrated in FIG. 20, current may flow from the second terminal 108 through the third elevated power plane 130 to the rightmost configuration of one or more power substrates 606. From the rightmost configuration of one or more power substrates 606, the current will flow therethrough to the power devices 302 arranged on the rightmost configuration of one or more power substrates 606. Thereafter, the current flows from the power devices 302 arranged on the rightmost configuration of one or more power substrates 606 up through the power connections 628 to the first elevated power plane 126 and thereafter to the leftmost configuration of one or more power substrates 606.

The current then flows from the leftmost configuration of one or more power substrates 606 to the power devices 302 arranged on the leftmost configuration of one or more power substrates 606. Thereafter, the current flows from the power devices 302 arranged on the leftmost configuration of one or more power substrates 606 through their respective ones of the power connections 628 to the second elevated power plane 128, which flows to the third terminal 110.

Figure 21:
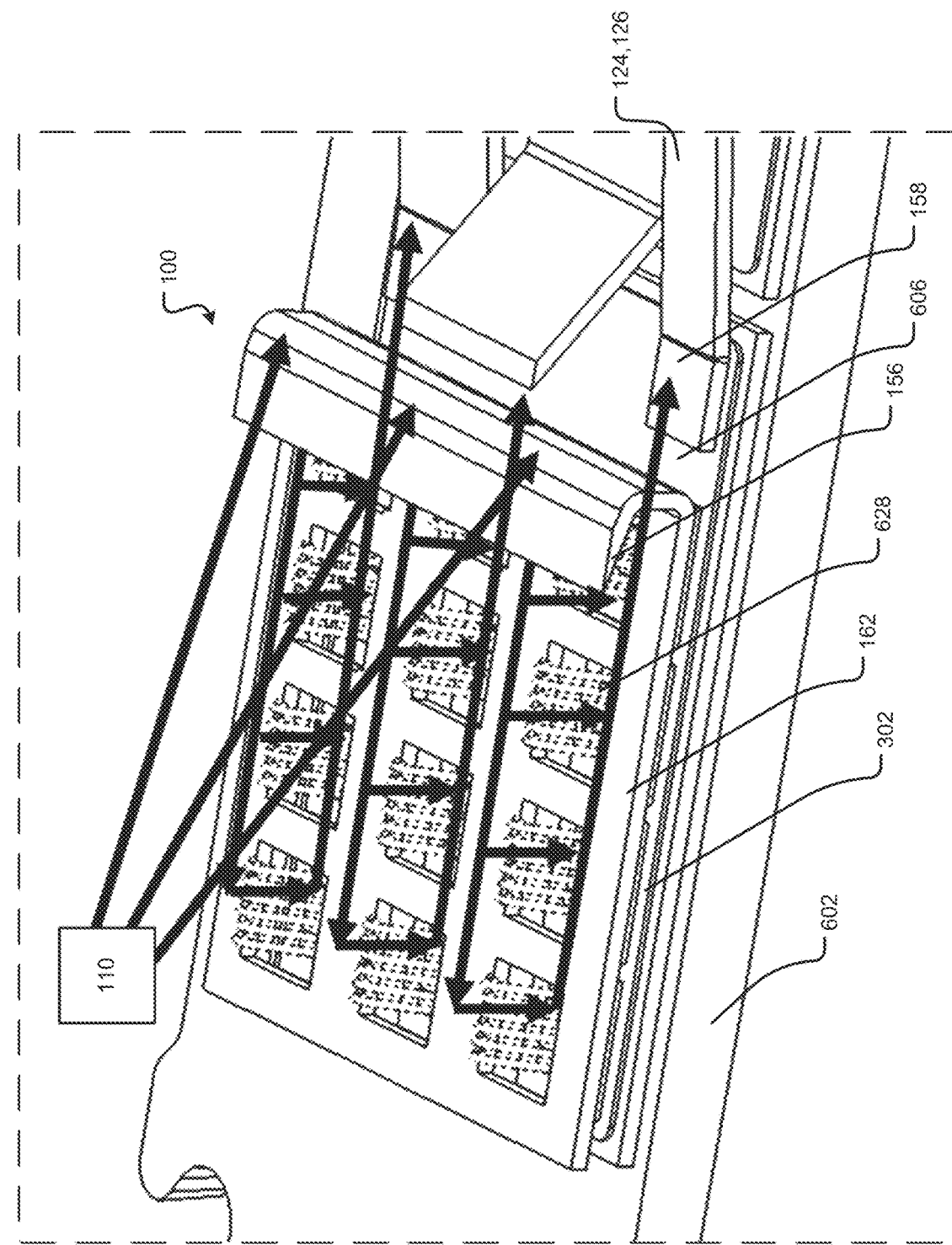
FIG. 21 illustrates current flow through the power module of FIG. 10.

FIG. 21 illustrates current flow through the power module of FIG. 10.

In particular, FIG. 21 illustrates an exemplary current flow through the power module 100 when the power devices 302 are accordingly controlled. In particular, the power devices 302 may be controlled for multiple variations of current flow through the power module 100. Accordingly, the flow of current illustrated in FIG. 21 is merely one of the many possible flows of current through the power module 100.

With reference to FIG. 21, currents may flow from the third terminal 110 to the fourth power plane portion 156 and thereafter to the seventh power plane portion 162 which is arranged on the left most configuration of one or more power substrates 606. Thereafter, the current may flow through the seventh power plane portion 162 to the power connections 628 down to the power devices 302 that are arranged on the left most configuration of one or more power substrates 606. The current may then flow through the power devices 302 that are arranged on the left most configuration of the one or more power substrates 606 and into the left most configuration of one or more power substrates 606. Thereafter, the current may flow through the left most configuration of one or more power substrates 606 to the fifth power plane portion 158 and subsequently to the first elevated power plane 126 and the first terminal 106.

Accordingly, as illustrated in FIG. 20 and FIG. 21, the power module 100 may be configured to evenly distribute current between large arrays of the power devices 302 with a significantly lower loop inductance than standard packaging approaches. The layout of the power module 100 is highly configurable and may be configured to adopt most power circuit topologies common in the power electronics industry.

In the case of lowering package inductance, the layered planar geometry of the at least one elevated power plane 124 above the power substrates 606 provides a near ideal low inductance loop geometry (small conductor separation, short total path, and wide current path).

To achieve a low internal inductance, the current paths of the power module 100 as illustrated in FIG. 20 and FIG. 21 may be wide, short in length, and overlap whenever possible to achieve flux cancellation. Flux cancellation occurs when the current traveling through the loop moves in opposing directions in close proximity, effectively counteracting their associated magnetic fields. A principal benefit of this module approach is that the entire width of the footprint is utilized for conduction. Module height may be minimized to reduce a length the current must travel through the structure.

Additionally, the power devices 302 may be placed in close proximity to the seventh power plane portion 162, minimizing imbalances in their relative loop inductances and ensuring excellent thermal coupling. The identified path illustrated in FIG. 20 in FIG. 21 is low inductance, owing to the following factors:

Low height of the module.

Close proximity of the power device 302 to the seventh power plane portion 162, the first terminal 106, the second terminal 108, the third terminal 110, the at least one elevated power plane 124, and/or the like Tight packing of all functional elements.

Optimized paralleled implementations of the power connections 628 for each of the power devices 302.

Even current sharing between the power devices 302.

Flux cancellation when the current direction reverses in the low side switch position.

In all, this low inductance, high current interconnection structure may be necessary for and enabled by the disclosed power module design. Together, they form an effective and highly integrated low inductance path between the switch positions 104. This structure allows for efficient, stable, and very high frequency switching of the power devices 302 such as wide band gap semiconductors.

These benefits, altogether, allow for lower switching losses, higher switching frequencies, improved controllability, and reduced EMI. Ultimately, this helps system designers achieve more power dense and robust power conversion systems.

With reference back to FIG. 4, the power module 100 may further include a housing 198 and/or the like. The housing 198 may be formed of a synthetic material. In one aspect, the housing 198 may be an injection molded plastic element. The housing 198 may provide electrical insulation, voltage creepage and clearance, structural support, and cavities for holding a voltage and moisture blocking encapsulation. In one aspect, the housing 198 may be formed in an injection molding process with reinforced high temperature plastic. The power module 100 and/or the housing 198 may include a gasket. The gasket may improve an encapsulation process by providing a liquid tight seal. In this regard, the power module 100 may include dielectric encapsulation within. The gasket may be injection molded, dispensed, or the like, and may be applied in a groove.

The power module 100 may further include captive fasteners. The captive fasteners may be hex nuts placed in the housing 198 and may be held captive underneath the edge power contacts, the first terminal 106, the second terminal 108, the third terminal 110, and/or the like after they are folded over. Other types of fasteners or connectors are contemplated to implement the captive fasteners. The captive fasteners may facilitate electrical connection to external buss bars or cables. The captive fasteners may be arranged such that when the power module 100 is bolted to buss bars, the captive fasteners and the first terminal 106, the second terminal 108, the third terminal 110, and/or the like are pulled upwards into the bussing, forming a better quality electrical connection. If the captive fasteners were affixed to the housing 198, they could act to pull the bussing down into the power module 100, which could form a poor connection due to the stiffness of the buss bars.

In one aspect, the housing 198 may include a lid and the housing 198 may include an aperture having a shape consistent with the external shape of the captive fasteners to prevent the captive fasteners from rotating. A corresponding fastener may be received by the captive fasteners. The corresponding fastener extending through a fastener hole in the first terminal 106, the second terminal 108, the third terminal 110, and/or the like to facilitate electrical connection to external buss bars or cables.

The disclosed power modules 100 may include a cold plate. The cold plate may be a high performance liquid cold plate, heat sink, or the like, serving to transfer waste heat away from the power modules 100 to another place (liquid, air, etc.).

For a paralleled array of power devices 302 such as transistors, particularly MOSFETs, the timing and magnitude of the gate currents must be balanced to result in consistent turn-on and turn-off conditions. The power module 100 may utilize individual ballasting resistors that may be placed in close proximity to the gate of the power devices 302, only separated by the gate wire bond. The individual ballasting resistors may be of low resistance and aid in buffering a current flowing to each individual ones of the power devices 302. The individual ballasting resistors act to decouple the gates of the power devices 302, preventing oscillations and helping to ensure an equalized turn on signal for the paralleled configurations of the power devices 302. A singular external resistor may be utilized and connected to these paralleled resistors for controlling the turn on speed of the switch position 104. In one aspect, a ballasting resistor may be associated with each power device 302. In one aspect, an individual ballasting resistor may be associated with each individual ones of the power devices 302.

In additional aspects, the power module 100 may utilize individual ballasting source Kelvin resistors that may be placed in close proximity to the source Kelvin connection of the power devices 302. In one aspect, the source Kelvin resistors may only be separated by the source Kelvin wire bond. In one aspect, a source Kelvin resistor may be associated with each power device 302. In one aspect, an individual source Kelvin resistor may be associated with each individual ones of the power devices 302. The source Kelvin resistors may be of a low resistance and aid in buffering a current flowing to the source Kelvin connection of each of the individual ones of the power devices 302. The source Kelvin resistors may act to decouple the source Kelvin connections of the power devices 302, preventing oscillations and helping to ensure an equalized signal for the paralleled configurations of the power devices 302. In particular aspects, the source Kelvin resistors may be configured and implemented to address any mismatch of the individual ones of the power devices 302, a layout of the individual ones of the power devices 302, and the like.

In particular aspects, the source Kelvin resistors may be configured and implemented to prevent or reduce feedback oscillation between the individual ones of the power devices 302, dampen feedback oscillation between the individual ones of the power devices 302, decouple the source Kelvin signals between the individual ones of the power devices 302, inhibit current flowing between the source Kelvin signals for the individual ones of the power devices 302, equalize current flowing between the source Kelvin signals for the individual ones of the power devices 302, force current flowing through the individual ones of the power devices 302 to flow through a current path, and the like. Moreover, the source Kelvin resistors may reduce signaling inductance, ensure gate operation of the power devices 302 is not slowed, minimize gate/source over-voltage in the power devices 302, and the like.

The source Kelvin resistors may be a surface mount package, an integrated thick film layer, printed thick film, a wire bondable chip, a "natural" resistance path (material/structure interface that adds resistance), or the like depending on the application. In one or more aspects, the resistance value of the source Kelvin resistors and the resistors may be equivalent. In one or more aspects, the resistance value of the source Kelvin resistors and the resistors may be different.

In one aspect, the power module 100 may be implemented in a wide variety of power topologies, including half-bridge, full-bridge, three phase, booster, chopper, DC-DC converters, and like arrangements and/or topologies.

In one aspect, the power module 100 may include a plurality of pin fins. In one aspect, the plurality of pin fins may be configured for transferring heat from one or more components of the power module 100. In one aspect, the plurality of pin fins may be configured for cooling of one or more components of the power module 100. In one aspect, the plurality of pin fins may be configured for direct cooling of one or more components of the power module 100. In one aspect, the plurality of pin fins may be configured for direct cooling of one or more components of the power module 100 in conjunction with a cold plate. In one aspect, the plurality of pin fins may be configured for allowing coolant to pass through the pin fins.

In one aspect, the power module 100 may be inserted into an application, implemented with the application, configured with the application, or the like. The application may be a system implementing the power module 100. The application may be a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, and electric vehicles (EVs), a converter, and the like.

In particular, power module 100 may be implemented as a 3-phase inverter. In aspects, the inverter may be configured as two separate 3-phase inverters, one 3-phase inverter, one full-bridge, one half-bridge, and/or the like. In one aspect, the inverter may be configured with six dedicated half bridges. In one aspect, the above-noted configurations may be structured and arranged with connections outside of the inverter. In one aspect, the above-noted configurations may include different versions of the power module 100 and/or other assembly components.

Figure 22:
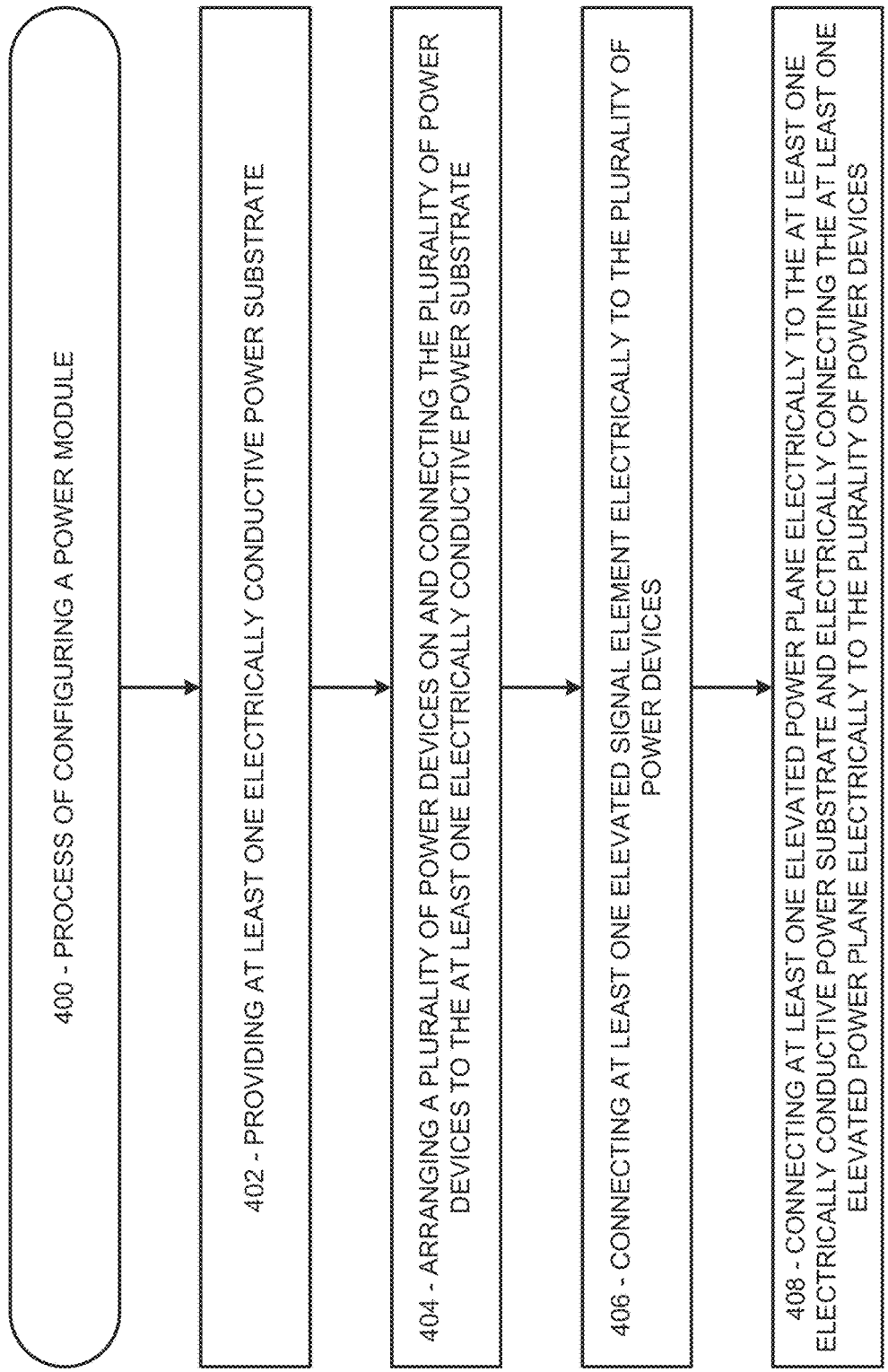
FIG. 22 illustrates a process of implementing a power module according to the disclosure.

FIG. 22 illustrates a process of implementing a power module according to the disclosure.

In particular, FIG. 22 illustrates a process of configuring a power module (box 400) that relates to implementing, making, manufacturing, forming, and/or the like the power module 100 as described herein. It should be noted that the aspects of process of configuring a power module (box 400) may be performed in a different order consistent with the aspects described herein. Moreover, the process of configuring a power module (box 400) may be modified to have more or fewer processes consistent with the various aspects disclosed herein.

Initially, the process of configuring a power module (box 400) may include providing at least one electrically conductive power substrate (box 402). More specifically, the one or more power substrates 606 may be constructed, configured, and/or arranged as described herein.

The one or more power substrates 606 may provide electrical interconnection, voltage isolation, heat transfer, and the like for the power devices 302. The one or more power substrates 606 may be constructed as a direct bond copper (DBC), an active metal braze (AMB), an insulated metal substrate (IMS), or the like. In the case of the IMS structure, the one or more power substrates 606 and the base plate 602 may be integrated as the same element. In some aspects, the one or more power substrates 606 may be attached to the base plate 602 with solder, thermally conductive epoxy, sintering or the like. In one aspect there may be two of the power substrates 606, one for each switch position 104. In one aspect, the power substrates 606 may include insulating materials, insulating layers, and/or the like.

Further, the process of configuring a power module (box 400) may include arranging a plurality of power devices on and connecting the plurality of power devices to the at least one electrically conductive power substrate (box 404). More specifically, the power devices 302 may be constructed, configured, and/or arranged as described herein on the one or more power substrates 606.

The power devices 302 may be attached with solder, conductive epoxy, a sintering material, or the like. The power devices 302 may be distributed about a surface of the one or more power substrates 606 in any arrangement which affords an advantage to a desired property such as heat distribution, power distribution, inductance balancing, and/or similar.

Additionally, the process of configuring a power module (box 400) may include connecting at least one elevated signal element electrically to the plurality of power devices (box 406). More specifically, the at least one elevated signal element 118 may be constructed, configured, and/or arranged as described herein. Additionally, the at least one elevated signal element 118 may be electrically connected to the power devices 302 by the signal connections 626.

In particular, the at least one elevated signal element 118 may include a first elevated signal element 120 and a second elevated signal element 122. However, the at least one elevated signal element 118 may include any number of elevated signal elements. The signal connections 626 may extend vertically upward from the power devices 302 to the at least one elevated signal element 118, the second elevated signal element 122, and/or the first elevated signal element 120.

Additionally, the process of configuring a power module (box 400) may include connecting at least one elevated power plane electrically to the at least one electrically conductive power substrate and electrically connecting the at least one elevated power plane electrically to the plurality of power devices (box 408). More specifically, the at least one elevated power plane 124 may be constructed, configured, and/or arranged as described herein. Additionally, the at least one elevated power plane 124 may be electrically connected to the one or more power substrates 606. In this regard, the at least one elevated power plane 124, the first elevated power plane 126, the second elevated power plane 128, the third elevated power plane 130, the fifth power plane portion 178, the second elevated power plane 128, the sixth power plane portion 160, and/or the like may be connected to the one or more power substrates 606.

Additionally, the at least one elevated power plane 124, the first elevated power plane 126, the second elevated power plane 128, the third elevated power plane 130, the seventh power plane portion 162, and/or the like may be connected to the power devices 302 by the power connections 628.

Additionally, the process of configuring a power module (box 400) may include additional processes consistent with the disclosure including the specification and Figures.

Accordingly, the disclosure has set forth a power module that includes an elevated and supported metal layer above the power devices where area is freed up on the substrate to add more power devices, additional components (e.g., thermal sensors, current sensors, capacitors, etc.), larger metal planes to carry more current, easier layout geometries, more flexibility on where parts are placed, or any combinations of these, resulting in a higher density power module package. Moreover, the disclosure has set forth a power module that makes the substrate layout simpler, allows for a higher power density module, and/or the like.

Additionally, the disclosure has set forth a power module with an elevated signal board and an elevated power plane that further simplifies the geometry of the conducting plane on top of the substrate. This integration allows for more design flexibility in routing power and signal paths to the power devices. Effectively, introducing an additional layer of metal into the power module can also increase the overall ampacity of the power module. The added range of choice in signal and power path routing coupled with a greater range of choice for device layout/location can have added benefits in terms of allowing a lower device density or positioning for better thermal performance and for lower package inductances.

Additionally, the disclosure has set forth a power module configured for lowering package inductance. In particular, the layered planar geometry of the elevated power plane above the substrate power plane provides a near ideal low inductance loop geometry (small conductor separation, short total path, and wide current path).

Accordingly, the disclosure has also set forth an improved power module 100 and associated system configured to address parasitic impedances, such as loop inductance, to increase stability, decrease switching losses, reduce EMI, and limit stresses on system components.

In particular, the disclosed power module 100 may be implemented in numerous topologies including a half-bridge configuration, a full-bridge configuration, a common source configuration, a common drain configuration, a neutral point clamp configuration, and a three-phase configuration. Applications of the power module 100 include motor drives, solar inverters, circuit breakers, protection circuits, DC-DC converters, and the like.

The power module 100 of the disclosure is adaptable for most systems within the power processing needs and size and weight restrictions specific for a given application. The power module design and system level structures described in the disclosure allow for a high level of power density and volumetric utilization to be achieved.

Additionally, various aspects of the disclosure may also apply to medium-voltage and high-voltage packages. For example, the packages may include hermetic, press pack-style (or "hockey puck") packages. For example, packages that include various electrical components such packages having one or more rectifiers, one or more fast-recovery diodes, one or more thyristors and/or the like.

In this regard, applications of the disclosure utilizing such packaging technology has the following advantages over non-hermetic plastic housing modules: 1) a hermetic package suitable for all cooling options including direct liquid immersion (i.e., using engineered dielectric fluids); 2) more explosion and rupture resistant; 3) high thermal cycling resistance; 4) double-sided cooling may be possible; and 5) mechanically compatible with GTO thyristors and rectifiers allowing upgrading of existing equipment and designs to new SiC MOSFET, IGBT, or GTO technology. Also, press packs use bondless construction (i.e., mechanical pressure) for achieving high reliability electrical connections. These single-switch hermetic packages may then be stacked in series for higher voltage operation or in multilevel topologies. In one aspect, the packages may be connected in series to achieve higher voltages.

In one aspect, the medium-voltage and high-voltage packages may include one or more of the various aspects of the disclosure. In this regard, the electrical components may be arranged on the power substrates 606. The at least one elevated power plane 124 may be arranged over the power substrates 606 and may include the power connections 628 to the electrical components. Additionally, the at least one elevated signal element 118 may be arranged over the power substrates 606 and may include the signal connections 626 to the electrical components.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power module, comprising:
   at least one electrically conductive power substrate;
   a plurality of power devices arranged on and connected to the at least one electrically conductive power substrate;
   at least one elevated signal element electrically connected to the plurality of power devices and arranged above the at least one electrically conductive power substrate; and
   at least one elevated power plane electrically connected to the at least one electrically conductive power substrate, electrically connected to the plurality of power devices, and arranged vertically offset from the at least one electrically conductive power substrate,
   wherein the at least one elevated power plane comprises at least one window.

2. The power module of claim 1, wherein:
   the at least one elevated power plane comprises a first elevated power plane arranged above a first implementation of the at least one electrically conductive power substrate and a first group of the plurality of power devices,
   the at least one elevated power plane comprises a second elevated power plane arranged above a second implementation of the at least one electrically conductive power substrate and a second group of the plurality of power devices, and the at least one elevated power plane comprises a third elevated power plane arranged above the second elevated power plane.

3. The power module of claim 1, wherein:
the at least one elevated signal element comprises one of the following: a printed circuit board (PCB) or an insulated metal substrate (IMS);
the at least one elevated signal element comprises a first elevated signal element arranged above a first implementation of the at least one electrically conductive power substrate and a first group of the plurality of power devices; and
the at least one elevated signal element comprises a second elevated signal element arranged above a second implementation of the at least one electrically conductive power substrate and a second group of the plurality of power devices.

4. The power module of claim 3, wherein:
the at least one elevated signal element comprises the insulated metal substrate (IMS) with a metal layer configured as a high-current conductor.

5. The power module of claim 1, wherein:
the at least one elevated signal element is arranged in one of the following: vertically offset from and separated from the at least one elevated power plane, arranged vertically offset from and on the at least one elevated power plane, and arranged vertically offset from and directly on the at least one elevated power plane;
the at least one elevated signal element comprises a first elevated signal element arranged above a first implementation of the at least one electrically conductive power substrate and a first group of the plurality of power devices; and
the at least one elevated signal element comprises a second elevated signal element arranged above a second implementation of the at least one electrically conductive power substrate and a second group of the plurality of power devices.

6. The power module of claim 1,
wherein the at least one window comprises a plurality of first windows; and
wherein each of the plurality of power devices are arranged to be associated with one of the plurality of first windows.

7. The power module of claim 6, wherein:
the plurality of first windows are configured to allow power connections to extend vertically from the power devices to the at least one elevated power plane; and
the plurality of first windows are configured to allow signal connections to extend vertically from the power devices to the at least one elevated signal element.

8. The power module of claim 1,
wherein the power devices are arranged in a pattern on the at least one electrically conductive power substrate;
wherein the at least one elevated power plane comprises a first power plane portion, a second power plane portion, and a third power plane portion; and
wherein the third power plane portion is inclined with respect to a vertical axis.

9. The power module of claim 1, wherein:
the at least one elevated signal element comprises a plurality of second windows; and
each of the plurality of power devices are arranged to be associated with one of the plurality of second windows.

10. The power module of claim 9, wherein:
the plurality of second windows are configured to allow signal connections to extend vertically from the power devices to the at least one elevated signal element.

11. The power module of claim 1, further comprising:
one or more sensors,
wherein the one or more sensors are arranged on one of the following: the at least one elevated power plane and the at least one electrically conductive power substrate, and
wherein the one or more sensors are connected to the at least one elevated signal element.

12. A power module, comprising:
at least one electrically conductive power substrate;
a plurality of power devices arranged on and connected to the at least one electrically conductive power substrate;
at least one elevated signal element electrically connected to the plurality of power devices and arranged above the at least one electrically conductive power substrate; and
at least one elevated power plane electrically connected to the at least one electrically conductive power substrate, electrically connected to the plurality of power devices, and arranged vertically offset from the at least one electrically conductive power substrate,
wherein the at least one elevated power plane comprises at least one window; and
wherein the plurality of power devices comprise power connections that connect the plurality of power devices to the at least one elevated power plane through the at least one window.

13. A power module, comprising:
at least one electrically conductive power substrate;
a plurality of power devices arranged on and connected to the at least one electrically conductive power substrate;
at least one elevated signal element electrically connected to the plurality of power devices; and
at least one elevated power plane electrically connected to the at least one electrically conductive power substrate and electrically connected to the plurality of power devices,
wherein the at least one elevated power plane comprises at least one window;
wherein the at least one elevated signal element comprises at least one window;
wherein the at least one elevated power plane is arranged vertically offset from the at least one electrically conductive power substrate; and
wherein the at least one elevated signal element is arranged vertically offset from the at least one elevated power plane.

14. The power module of claim 13, wherein:
the at least one elevated power plane comprises a first elevated power plane arranged above a first implementation of the at least one electrically conductive power substrate and a first group of the plurality of power devices,
the at least one elevated power plane comprises a first elevated power plane a second elevated power plane arranged above a second implementation of the at least one electrically conductive power substrate and a second group of the plurality of power devices, and
the at least one elevated power plane comprises a third elevated power plane arranged above the second elevated power plane.

15. The power module of claim 13, wherein:
the at least one elevated signal element is implemented using one of the following: a printed circuit board (PCB) and an insulated metal substrate (IMS);
the at least one elevated signal element comprises a first elevated signal element arranged above a first implementation of the at least one electrically conductive power substrate and a first group of the plurality of power devices; and
the at least one elevated signal element comprises a second elevated signal element arranged above a second implementation of the at least one electrically conductive power substrate and a second group of the plurality of power devices.

16. The power module of claim 15, wherein:
the at least one elevated signal element implements the insulated metal substrate (IMS) with a bottom metal layer configured as a high-current conductor.

17. The power module of claim 13, wherein:
the at least one window comprises a plurality of first windows; and
the power devices comprise power connections that connect the power devices to the at least one elevated power plane; and
each of the power devices are arranged to be associated with one of the plurality of first windows.

18. The power module of claim 13, wherein:
the at least one elevated signal element is arranged in one of the following: vertically offset from and separated from the at least one elevated power plane, arranged vertically offset from and on the at least one elevated power plane, and arranged vertically offset from and directly on the at least one elevated power plane;
the at least one elevated signal element comprises a first elevated signal element arranged above a first implementation of the at least one electrically conductive power substrate and a first group of the plurality of power devices; and
the at least one elevated signal element comprises a second elevated signal element arranged above a second implementation of the at least one electrically conductive power substrate and a second group of the plurality of power devices.

19. The power module of claim 13,
wherein the at least one window comprises a plurality of first windows; and
wherein each of the power devices are arranged to be associated with one of the plurality of first windows.

20. The power module of claim 19, wherein:
the plurality of first windows are configured to allow power connections to extend vertically from the power devices to the at least one elevated power plane; and
the plurality of first windows are configured to allow signal connections to extend vertically from the power devices to the at least one elevated signal element.

21. The power module of claim 13, further comprising a plurality of rows of the power devices extending along a first axis and a plurality of rows of the power devices extending along a second axis,
wherein the at least one elevated power plane comprises a first power plane portion, a second power plane portion, and a third power plane portion; and
wherein the third power plane portion is inclined with respect to a vertical axis.

22. The power module of claim 13,
wherein the at least one window comprises a plurality of second windows; and
wherein each of the power devices are arranged to be associated with one of the plurality of second windows arranged in the at least one elevated signal element.

23. The power module of claim 22, wherein:
the plurality of second windows are configured to allow signal connections to extend vertically from the power devices to the at least one elevated signal element.

24. The power module of claim 13, further comprising:
one or more sensors,
wherein the one or more sensors are arranged on the at least one elevated power plane, and
wherein the one or more sensors are connected to the at least one elevated signal element.

* * * * *